US 11,851,753 B2

(12) United States Patent
Guercio et al.

(10) Patent No.: US 11,851,753 B2
(45) Date of Patent: *Dec. 26, 2023

(54) PROCESS FOR MANUFACTURING A SILICON CARBIDE COATED BODY

(71) Applicant: Applied Materials, Inc., Santa Clara, CA (US)

(72) Inventors: Peter J. Guercio, Queen Creek, AZ (US); Paul Westphal, Scottsdale, AZ (US); Kirk Allen Fisher, Tempe, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 16/957,571

(22) PCT Filed: Dec. 22, 2018

(86) PCT No.: PCT/US2018/067414
§ 371 (c)(1),
(2) Date: Jun. 24, 2020

(87) PCT Pub. No.: WO2019/133556
PCT Pub. Date: Jul. 4, 2019

(65) Prior Publication Data
US 2020/0325575 A1     Oct. 15, 2020

Related U.S. Application Data

(60) Provisional application No. 62/610,658, filed on Dec. 27, 2017.

(30) Foreign Application Priority Data

Jan. 18, 2018  (EP) ..................................... 18152232

(51) Int. Cl.
*C23C 16/00*  (2006.01)
*C23C 16/32*  (2006.01)
(Continued)

(52) U.S. Cl.
CPC ............ *C23C 16/325* (2013.01); *C01B 32/21* (2017.08); *C23C 16/045* (2013.01)

(58) Field of Classification Search
CPC ...................................................... C23C 16/00
See application file for complete search history.

(56) References Cited

U.S. PATENT DOCUMENTS 3,179,679 A * 4/1965 Ashby ................... C07F 7/0834
556/452
9,371,582 B2 * 6/2016 Lee ..................... C23C 16/4405
(Continued)

FOREIGN PATENT DOCUMENTS

CN    107207373 A    9/2017
JP    2000302577 A   10/2000

OTHER PUBLICATIONS

Chinese Office Action dated Dec. 13, 2021 for Application No. 201880090317.5.
(Continued)

*Primary Examiner* — Gordon Baldwin
*Assistant Examiner* — Mohammad Mayy
(74) *Attorney, Agent, or Firm* — Patterson + Sheridan, LLP

(57) ABSTRACT

The present invention relates to a new process for manufacturing a silicon carbide (SiC) coated body by depositing SiC in a chemical vapor deposition method using dimethyldichlorosilane (DMS) as the silane source on a graphite substrate. A further aspect of the present invention relates to the new silicon carbide coated body, which can be obtained by the new process of the present invention, and to the use (Continued)

thereof for manufacturing articles for high temperature applications, susceptors and reactors, semiconductor materials, and wafer.

11 Claims, 16 Drawing Sheets

(51) Int. Cl.
*C01B 32/21* (2017.01)
*C23C 16/04* (2006.01)

(56) References Cited

U.S. PATENT DOCUMENTS

| | | | | |
|---|---|---|---|---|
| 9,837,270 | B1* | 12/2017 | Varadarajan | H01L 21/76834 |
| 2007/0003749 | A1* | 1/2007 | Asgari | C08J 3/24 |
| | | | | 428/304.4 |
| 2016/0111272 | A1* | 4/2016 | Girard | H01L 21/02271 |
| | | | | 438/770 |
| 2016/0305015 | A1* | 10/2016 | Nakamura | H01L 21/02381 |

OTHER PUBLICATIONS

Choi et al., "Chemical vapour deposition of silicon carbide by pyrolysis of methylchlorosilanes", Journal of Materials Science Letters, 1997, vol. 16, pp. 33-36.
Seyferth, "Dimethyldichlorosilane and the Direct Synthesis of Methylchlorosilanes. The Key to the Silicones Industry", Organometallics, 2001, vol. 20, pp. 4978-4992.
Japanese Office Action dated Sep. 14, 2021 for Application No. 2020-535535.
International Search Report and the Written Opinion of the International Searching Authority for PCT/US2018/067414, dated Mar. 22, 2019.
Concise Statement of Relevance for Office Action for Korean Patent Application No. 10-2020-7021799 dated Mar. 28, 2022.
Korean Office Action dated Mar. 28, 2022 for Application No. 10-2020-7021799.
Chinese Office Action dated May 24, 2022 for Application No. 201880090317.5.
Japanese Office Action dated Jul. 5, 2022 for Application No. 2020-535535.
EP Office Action for Application No. 18834283.6 dated Mar. 9, 2023.
Korean Office Action for Application No. 10-2022-7043053 dated Aug. 28, 2023.

* cited by examiner

PROCESS FOR MANUFACTURING A SILICON CARBIDE COATED BODY

This application is a National Phase Application under 35 U.S.C. 371 of International Application No. PCT/US2018/067414, filed Dec. 22, 2018, which claims priority to U.S. Provisional Patent Application No. 62/610,658 filed Dec. 27, 2017, and EP Application No. 18152232.7, filed Jan. 18, 2018 all of which are incorporated by reference in their entireties.

The present invention relates to a new process for manufacturing a silicon carbide (SiC) coated body by depositing SiC in a chemical vapor deposition method using dimethyldichlorosilane (DMS) as the silane source on a graphite substrate. A further aspect of the present invention relates to the new silicon carbide coated body, which can be obtained by the new process of the present invention, and to the use thereof for manufacturing articles for high temperature applications, susceptors and reactors, semiconductor materials, and wafer.

BACKGROUND OF THE INVENTION

SiC coated bodies are important products in various technical fields and are particularly useful for high temperature applications such as susceptors and wafer for applied materials and reactors, semiconductor materials, chip manufacturing etc.

In particular in high temperature applications and when applied in high precision devices it is of particular importance to provide SiC coated bodies (SiC coated articles), which exhibit superior mechanical properties, such as a tight connection (adhesion) of the SiC coating layer to the underlying substrate. Further, high etch resistance, impact resistance, fracture toughness and/or crack resistance of the SiC coated body are of particular interest. To provide oxidation resistance of the coated body it is further required to apply the SiC coating layer homogeneously and continuously, providing an impervious coating layer on the coated substrate surface.

The inventors of the present invention surprisingly found, that with the new process as described herein, it is possible to deposit SiC not only as a layer coating the surface of the underlying graphite substrate, but to achieve the formation of SiC tendrils being formed of improved deposited SiC material, growing into the pores of a porous graphite substrate. This provides SiC coated graphite articles with improved physical and mechanical properties. In particular, the formation of tendrils formed of the improved SiC material and extending into the porous graphite provides significantly improved mechanical properties as described below in more detail.

Different methods for applying a SiC coating by chemical vapor deposition (CVD) onto various substrates exist, comprising methods using DMS as the silane source in the CVD method (also designated as CVD precursor) and the deposition of SiC onto carbonaceous substrates, including graphite.

GB 1,128,757 describes methods for preparing SiC and describes CVD methods using either mixtures of hydrogen and a carbon-containing compound and a silicon-containing compound or mixtures of hydrogen and a compound containing both carbon and silicon, to form silicon carbide crystallized on heated surfaces as a dense, substantially impermeable film of predominantly beta-silicon carbide. In particular, the method is controlled to form stoichiometric silicon carbide. As a compound containing both carbon and silicon the document mentions inter alia DMS without providing specific process conditions to control the stoichiometric SiC formation from DMS. The formation of tendrils, let alone particular process conditions to achieve the formation of SiC tendrils extending into the coated substrate are also not described.

Similarly JP2000-302576 describes methods for preparing SiC coated graphite material using CVD methods and mentioning inter alia DMS as a possible CVD precursor. However, therein the SiC is only deposited on the surface of the graphite substrate and infiltration of a porous graphite substrate with the Si-containing gas is discussed as disadvantageous due to the difficulties in forming a uniform layer and in the additional costs for additional coating of the infiltrated intermediate layer. No specific process conditions for using DMS as a CVD precursor are disclosed nor can be found any teaching about a possible formation of tendrils extending into the coated substrate.

EP 0935013 A1 and EP 1072570 A1 both describe methods of depositing a SiC coating on graphite substrates and thereafter removing the substrate. Consequently, none of said documents teaches the formation of SiC tendrils extending into the porous graphite to form a tightly connected SiC coating layer. Further, none of said documents describes specific process conditions for achieving the effects of the present invention. In particular, EP 0935013 teaches quite high temperature conditions for the CVD process. Although, both documents generally mention the possibility to use DMS as the CVD precursor, none of said document teaches suitable process conditions to deposit substantially stoichiometric SiC, i.e. SiC with a ratio of Si:C of 1:1 by using DMS.

U.S. Pat. No. 9,371,582 teaches a method of depositing SiC using microwave plasma enhanced chemical vapor deposition (MPECVD). Said very specific plasma based process differs significantly from the process conditions described in the present invention and accordingly, it cannot be concluded that similar effects could be achieved therewith as have been found within the present invention.

EP 0294047 A1 relates to a process for minimizing carbon content in semiconductor materials by pre-treating carbonaceous surfaces used for the preparation of semiconductor materials and mentions the general possibility of coating graphite samples with SiC using CVD and for example DMS as the CVD precursor. Particular process conditions to achieve the formation of SiC tendrils extending into the coated substrate are not described.

EP 0121797 A2 describes the preparation of carbon-silicon composite articles comprising the deposition of impermeable, uniform SiC-coating layers onto a starting substrate by CVD. Example 6 mentions the use of DMS as CVD precursor for encasing substrate fibers with a film. Example 9 mentions the deposition of a SiC coating by CVD using methylchlorosilane in and on molded granular graphite as the substrate to form an intermediate substrate. Particular process conditions to achieve the formation of SiC tendrils extending into a coated porous graphite substrate are not described.

U.S. Pat. No. 4,976,899 A describes the deposition of SiC onto a porous composite matrix comprising reinforcing carbon fibers coated with carbon and SiC, which are embedded in a deformable resin and carbon-based matrix by the well-known chemical vapor deposition (CVD) method using e.g. DMS in the presence of methane and hydrogen. Therein, the composite matrix is covered by a SiC coating layer, which may penetrate and impregnate the porous structure of the resin substrate. The SiC coating layer applied therein exhibits cracks, which have to be filled and sealed subsequently by applying a further outer coating layer, e.g. an aluminum or hafnium nitride coating and a further outer alumina coating or a borosilicate glass to provide a coated article which fulfills the required heat protection and oxidation resistance sufficiently. Particular process conditions to achieve the formation of SiC tendrils extending into a homogenously coated porous graphite substrate are not described.

U.S. Pat. No. 3,925,577 A describes a process for producing a coated isotropic graphite member comprising depositing a layer of silicon on a porous graphite body by a gas phase reaction at a temperature below the melting point of the silicon, followed by heating the graphite member with the applied layer of silicon to a temperature to cause the silicon to melt and penetrate the pores of the graphite and cause the silicon to react in situ with the graphite to form a layer of silicon carbide and further depositing by a gas phase reaction a sealing layer of silicon carbide over the underlying, previously reacted silicon carbide layer. The graphite used therein is defined to exhibit a porosity equal to about 18% to 25% of the member volume, which inter alia is described to be mandatory to provide silicon carbide coated-isotropic fine grain graphite with the desired strength properties. Departing from the defined graphite characteristics is said to lead to composites exhibiting separated, cracked or spelled coating in high temperature applications. The process described therein comprises the mandatory step of surface cleaning the heat treated isotropic graphite member, thereby removing all loose surface particles, prior to subjecting the graphite article to the SiC coating step. The CVD method described therein is carried out using silicon tetrachloride as the CVD precursor in the presence of hydrogen and methane. Argon may also be present as an inert gas. The use of DMS as the CVD precursor or silane source is not mentioned. Particular process conditions to achieve the improved SiC coated articles of the present invention with the formation of SiC tendrils extending into a coated porous graphite substrate are not described.

US2012/040139 and the corresponding U.S. Pat. No. 9,145,339 describe a very similar process of depositing SiC by allowing molten silicon to penetrate into a porous substrate material. Said substrate is described to have a porosity degree of 25 to 45%. Allowing molten silicon to penetrate into a porous substrate requires the presence of large pores, which is reflected in the high porosity degree, similar as in the above discussed U.S. Pat. No. 3,925,577 A. Large pores and a high porosity degree is, however, detrimental to the mechanical properties and strength of the graphite substrate. Further, by using molten silicon no highly crystalline SiC can be obtained but merely amorphous SiC, which can be seen from FIG. 9 below.

Also US2018/002236 (and JP2002-003285, cited therein as prior art document 1) relate to a process of depositing SiC on porous substrate with a comparably high porosity degree of 12 to 20% with a preferred porosity degree of at least 15%. It is stated therein, that SiC cannot be deposited by CVD methods in the depth of the substrate unless the porosity is 15 to 50%. In both documents DMS as a CVD precursor is mentioned only generally. Both documents describe particular process conditions only for different CVD precursor materials, such as in the example of US 2018/002236 the use of methyltrichlorosilane (MTS) to deposit SiC on a substrate with a porosity degree of 16%. In the examples of the cited JP2002-003285 the CVD precursor is also methyltrichlorosilane without specifying a specific porosity degree. With the process described therein, it is not possible to deposit the improved crystalline SiC material according to the present invention in a graphite substrate with lower porosity. With the process described therein also no tendrils according to the present invention can be formed.

U.S. Pat. No. 3,406,044 A describes a process for preparing resistant heating elements, comprising the application of silicon onto a carbonaceous material by using chemical vapor deposition of trichlorosilane. With the process applied therein a silicon layer is applied to the substrate, which penetrates into the porous substrate and converts therein to a certain amount into SiC. With the process described therein a silicon layer is applied, which comprises SiC to a certain but comparably small amount of about 9%. It is further described therein, that an applied SiC coating does not penetrate through the pores of the graphite substrate in a considerable amount but forms a rather gas-tight impervious coating on the surface of the graphite. The use of DMS as the CVD precursor is not mentioned. Particular process conditions to achieve the improved SiC coated articles of the present invention with the formation of SiC tendrils extending into a coated porous graphite substrate are not described.

U.S. Pat. No. 3,622,369 describes a process for depositing stoichiometric silicon carbide on resistively heated wires, using methyldichlorosilane and hydrogen together with a carbonizing gas such as methane in the CVD method. It is described, that with the use of said specific mixture of methyldichlorosilane as the silane source with hydrogen and methane the formation of silicon carbide filaments occurs. However, it is neither described therein, that such SiC filaments may grow into a porous graphite substrate nor that such filaments may be formed under different CVD reaction conditions such as with other CVC precursor materials like DMS in the presence of hydrogen without adding methane gas. In particular, process conditions to achieve the improved SiC coated articles of the present invention with the formation of SiC tendrils extending into a coated porous graphite substrate are not described.

GB 1,021,662 describes a method of filling pores of a porous substrate by chemical vapor deposition of organosilicon compounds by treating porous bodies with the aim to reduce the porosity and permeability thereof. Porous bodies as described therein mainly relate to silicon carbide bodies but also graphite, alumina and other porous inorganic bodies are mentioned. The reduction of the porosity is carried out therein by depositing SiC in the pores of the porous bodies using chemical vapor deposition of organosilicon compounds. Preferred organosilicon compounds are used which provide a SiC:C ratio of 1:1. As dimethyldichlorosilane per se is not suitable to provide such 1:1 ratio, this organosilicon compound is mentioned as possible CVD precursor only in combination with a silicon-yielding compound such as $SiCl_4$. Further, only one concrete Example describes the deposition of SiC on a carbon substrate, which is Example 3, wherein SiC is deposited on a piece of electrographite having 18% porosity by carrying out the CVD in the presence of $CH_3SiCl_3$. According to said Example 3 the porosity can be reduced to 15%, which indicates that the pore filling can only be achieved to a low degree. Particular process conditions to achieve the improved SiC coated articles of the present invention with the formation of SiC tendrils extending into a coated porous graphite substrate are not described.

D. Cagliostro and S. Riccitiello (J. Am. Ceram. Soc., 73 (3) 607-14; 1990) describe the analysis of pyrolysis products of dimethyldichlorosilane (DMS) in CVD methods using argon as purge gas. Said publication teaches, that the volatility, transport properties and reaction kinetics of the fractions formed in the CVD process affect the ability to penetrate, condense in and/or coat porous media and therefore affect morphology, densification and/or mechanical properties. This clearly supports the finding of the present invention that the very specific process conditions are critical to achieve the surprising effects described herein. For example the specific selection of the CVD precursor, the purge gas, the CVD conditions such as temperature, pressure and deposition time have been found to significantly influence the results in the CVD process.

Byung Jin Choi (Journal of Materials Science Letters 16, 33-36; 1997) confirms this. Therein the change of the structure of SiC deposited in a CVD method using different CVD precursor and applying varying CVD conditions (e.g. different temperatures) have been investigated. Inter alia DMS has been used as a CVD precursor at different temperatures and the formation of stoichiometric SiC has been observed. However, as can be seen therein, under the applied CVD conditions only amorphous SiC is deposited as shown therein (FIG. 7a) and as can be seen in the XRD pattern (FIG. 3), varying temperatures significantly influence the formation of SiC and of by-products. Further, said publication does not describe to deposit SiC on a porous substrate and accordingly does not describe the formation of SiC tendrils extending into a porous substrate.

Object of the Invention

One object of the present invention was to provide a new process, which allows to prepare articles comprising a SiC coated graphite substrate, which avoid the disadvantages of the prior art processes.

A further object of the present invention was to provide a process being able to provide SiC coated articles, wherein the SiC coating forms a tightly connected layer on the underlying graphite substrate.

A further object of the present invention was to provide a process avoiding the formation of cracks and spellings in the SiC coating A further object of the present invention was to provide a process for preparing a SiC coated graphite substrate article in a cost and time efficient manner by reducing the required process steps as far as possible.

A further object of the present invention was to provide a process for preparing graphite substrate based articles with a SiC coating exhibiting on the one hand sufficient mechanical resistance and strength and on the other hand also a maximum of continuity and homogeneity so that the application of additional coatings or sealing layers, e.g. to seal occurring cracks, is not necessary.

A further object of the present invention was to provide a new and improved SiC coated graphite substrate body having the desired improved properties as described herein.

A particular object of the present invention was to provide a new and improved SiC coated graphite substrate body having excellent mechanical strength, SiC deposited thereon with improved properties and characteristics and comprising a SiC coating which forms a layer that is tightly connected with the underlying graphite substrate. A further object of the present invention was to provide a new and improved SiC coated graphite substrate body having improved SiC characteristics with respect to SiC deposition and infiltration, SiC crystallinity, density, purity, Si:C ratio and/or strength.

A further object of the present invention was to provide a new and improved SiC coated graphite substrate body having improved graphite characteristics with respect to grain size, density and/or porosity.

A further object of the present invention was to provide an improved SiC coated graphite substrate body with an essentially pure SiC coating.

A further object of the present invention was to provide an improved SiC coated graphite substrate body with an improved SiC material deposited thereon and/or therein.

A further object of the present invention was to provide an improved SiC coated graphite substrate body with an improved SiC material of high crystallinity and/or a high degree of tetrahedral crystallinity and/or comprising low amounts of amorphous SiC.

A further object of the present invention was to provide an improved SiC coated graphite substrate body with a significantly low content of free Si in the SiC coating.

A further object of the present invention was to provide an improved SiC coated graphite substrate body having an improved averaged coefficient of thermal expansion between the graphite substrate and the SiC coating layer.

A further object of the present invention was to provide an improved SiC coated graphite substrate body having an improved residual compressive load in the SiC layer.

A further object of the present invention was to provide an improved SiC coated graphite substrate body having an improved impact resistance.

A further object of the present invention was to provide an improved SiC coated graphite substrate body having an improved fracture toughness.

A further object of the present invention was to provide an improved SiC coated graphite substrate body having an improved exfoliation, peeling and/or warpage resistance.

A further object of the present invention was to provide an improved SiC coated graphite substrate body having an improved adhesion between the graphite substrate and the SiC coating layer.

A further object of the present invention was to provide an improved SiC coated graphite substrate body exhibiting an improved relation between the size of the outer (upper) surface of the SiC coating layer to the size of the interfacial layer being formed by the SiC tendrils extending into the porous graphite substrate.

A further object of the present invention was to provide an improved SiC coated graphite substrate body having a multilayer SiC coating.

A further object of the present invention was to provide an improved SiC coated graphite substrate body having such a multilayer SiC coating, wherein at least two SiC layers of different porosity and/or density are present.

A further object of the present invention was to provide an improved SiC coated graphite substrate body as described herein, further having such a multilayer SiC coating.

A further object of the present invention was to provide a new process for preparing such improved SiC coated graphite substrate bodies.

A further object of the present invention was to provide a new method for depositing stoichiometric SiC on a substrate in a CVD method.

A further object of the present invention was to provide a new method for depositing stoichiometric SiC on a substrate in a CVD method without adding methane gas.

A further object of the present invention was to provide an improved graphite substrate, in particular for the use and the applications as described herein.

A further object of the present invention was to provide such an improved graphite substrate having improved purity.

A further object of the present invention was to provide such an improved graphite substrate having a modified surface porosity.

A further object of the present invention was to provide such an improved graphite substrate having small pores with enlarged surface pore diameters.

A further object of the present invention was to provide such an improved graphite substrate having a specific chlorine content.

A further object of the present invention was to provide a new method for preparing such an improved graphite substrate.

A further object of the present invention was to provide an activated graphite substrate with a modified surface porosity, in particular for the use and the applications as described herein.

A further object of the present invention was to provide such an activated graphite substrate having an improved purity.

A further object of the present invention was to provide such an activated graphite substrate having a specific chlorine content.

A further object of the present invention was to provide a new method for preparing such an activated graphite substrate.

A further object of the present invention was to provide a new method for depositing SiC on a substrate in a CVD method without using argon as purge gas.

The inventors of the present invention surprisingly found that these objects can be solved by the new process according to the present invention, which is described in detail as follows.

PREFERRED EMBODIMENTS OF THE INVENTION

The independent claims describe embodiments of the present invention for solving at least one of the above mentioned objects of the invention. The dependent claims provide further preferred embodiments, which contribute to solving at least one of the above mentioned objects of the invention.

[1] Process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(B) at least one further component being different from DMS and being a siloxane compound or a mixture of siloxane compounds,
wherein the content of the further component (B) is >0 to 2.00 wt. %, relating to the dimethyldichlorosilane precursor material.

[2] The process according to embodiment [1], wherein the dimethyldichlorosilane precursor material comprises a content of siloxane compounds (B) of >0 to 1.500 wt. %, preferably >0 to <1.040 wt. %, preferably >0 to 1.000 wt. %, preferably >0 to 0.900 wt. %, preferably >0 to 0.850 wt. %, preferably >0 to 0.800 wt. %, preferably >0 to 0.750 wt. %, preferably >0 to 0.700 wt. %, preferably >0 to 0.600 wt. %, preferably >0 to 0.500 wt. %.

[3] The process according to embodiments [1] or [2], wherein the dimethyldichlorosilane precursor material comprises a content of siloxane compounds (B) of not more than 0.500 wt. %, preferably not more than 0.450 wt. %, preferably not more than 0.400 wt. %, preferably not more than 0.375 wt. %.

[4] The process according to anyone of the preceding embodiments, wherein the dimethyldichlorosilane precursor material comprises >0 to 1.000 wt. % 1,3-dichloro-1,1,3,3,-tetramethyldisiloxane, preferably >0 to 0.850 wt. %, preferably >0 to 0.800 wt. %, preferably >0 to 0.750 wt. %, preferably >0 to 0.725 wt. %, preferably >0 to 0.710 wt. %, preferably >0 to <700 wt. %.

[5] The process according to anyone of the preceding embodiments, wherein the dimethyldichlorosilane precursor material comprises >0 to 0.200 wt. % 1,3-dichloro-1,1,3,5,5,5,-hexamethyltrisiloxane, preferably >0 to 0.150 wt. %, preferably >0 to 0.140 wt. %, preferably >0 to 0.130 wt. %, preferably >0 to 0.120 wt. %, preferably >0 to 0.110 wt. %, preferably >0 to <0.100 wt. %.

[6] The process according to anyone of the preceding embodiments, wherein the dimethyldichlorosilane precursor material comprises >0 to 0.200 wt. % octamethylcyclotetrasiloxane, preferably >0 to 0.190 wt. %, preferably >0 to 0.180 wt. %, preferably >0 to 0.170 wt. %, preferably >0 to 0.160 wt. %, preferably 0 to <0.150 wt. %.

[7] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(C) metal elements selected from the group consisting of Na, Mg, Al, Ca, Ti, Cr, Mn, Fe, Co, Ni, Cu, Zn, Mo and W,
wherein the content of the metal elements (C) is >0 to ≤30.00 ppm wt., preferably >0 to ≤25.00 ppm wt., preferably >0 to ≤20.00 ppm wt., relating to the dimethyldichlorosilane precursor material.

[8] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(C) a metal element selected from Mn,
wherein the content of the Mn metal element (C) is >0 to <150 ppb wt., preferably >0 to <100 ppb wt., preferably >0 to <50 ppb wt., preferably >0 to <40 ppb wt., preferably >0 to <30 ppb wt., preferably >0 to <20 ppb wt., preferably the content of Mn is between >0 and 40 ppb wt., relating to the dimethyldichlorosilane precursor material.

[9] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(C) a metal element selected from Cu,
wherein the content of the Cu metal element (C) is >0 to <50 ppb wt., preferably >0 to <45 ppb wt., preferably >0 to ≤40 ppb wt., preferably >0 to ≤35 ppb wt., preferably >0 to ≤30 ppb wt., preferably >0 to ≤25 ppb wt., preferably the content of Cu is between >0 and 25 ppb wt., relating to the dimethyldichlorosilane precursor material.

[10] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(C) a metal element selected from Zn,
wherein the content of the Zn metal element (C) is >0 to <50 ppb wt., preferably >0 to <45 ppb wt., preferably >0 to ≤40 ppb wt., preferably >0 to ≤35 ppb wt., preferably >0 to ≤30 ppb wt., preferably >0 to ≤25 ppb wt., preferably the content of Zn is between >0 and 25 ppb wt., relating to the dimethyldichlorosilane precursor material.

[11] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component and
(C) the metal elements Mn, Cu and Zn,
wherein the content of the Mn, Cu and Zn metal elements (C) is as defined in anyone of the embodiments [8] to [10].

[12] A process for manufacturing a silicon carbide (SiC) coated body in a chemical vapor deposition (CVD) method, using a dimethyldichlorosilane precursor material, wherein the dimethyldichlorosilane precursor material comprises
(A) dimethyldichlorosilane (DMS) as the main component;
(B) at least one further component being different from DMS and being a siloxane compound or a mixture of siloxane compounds as defined in anyone of the embodiments [1] to [6]; and
(C) one or more of the metal elements as defined in anyone of the embodiments [7] to [11], preferably Mn, Cu and Zn,
wherein the content of the siloxane component (C) is as defined in anyone of the embodiments [1] to [6] and the content of the one or more metal elements (C) is as defined in anyone of the embodiments [7] to [11].

[13] The process according to anyone of the preceding embodiments, wherein the chemical vapor deposition is carried out using $H_2$ as purge gas.

[14] The process according to anyone of the preceding embodiments, wherein the dimethyldichlorosilane precursor material is passed into the reaction chamber in a mixture with $H_2$.

[15] The process according to anyone of the preceding embodiments, wherein the mixture of the dimethyldichlorosilane precursor material and $H_2$ is obtained by introducing the $H_2$ gas into the tank containing the dimethyldichlorosilane precursor material, bubbling the $H_2$ through the tank and passing the mixture of the dimethyldichlorosilane precursor material and $H_2$ into the reaction chamber by pushing the mixture from the top of the tank.

[16] The process according to anyone of the preceding embodiments, wherein the dimethyldichlorosilane precursor material is further characterized by a content of one or more of the following elements of
calcium<60.00 ppb wt.,
magnesium<10.00 ppb wt.,
aluminium<12.00 ppb wt.,
titanium<1.00 ppb wt.,
chromium<60.00 ppb wt.,
iron<25000 ppb wt.,
cobalt<1.00 ppb wt.,
nickel<30.00 ppb wt.,
zinc<40.00 ppb wt.,
molybdenum<10.00 ppb wt.

[17] The process according to anyone of the preceding embodiments, wherein the dimethyldichlorosilane precursor material is used for depositing silicon carbide on a porous graphite substrate having an open porosity with a porosity degree of 6% to 15%, preferably of ≥6% and <15%, preferably of 6% to 13%, more preferably of 6 to <12%, more preferably of 9 to 11.5%.

[18] A silicon carbide coated body obtainable by a process according to any of the preceding embodiments, which is characterized by comprising a connected crystalline SiC material of substantially tetrahedral crystalline SiC.

[19] A silicon carbide coated body obtainable by a process according to any of the preceding embodiments or according to embodiment [18], comprising SiC is in the form of tendrils extending with a length of at least 50 µm, preferably of at least 75 µm length, preferably of at least 100 µm length, preferably of 75 to 200 µm length.

[20] A silicon carbide coated body obtainable by a process according to any of the preceding embodiments or according to embodiment [18] or [19], comprising SiC having an average particle size of up to 30 µm.

[21] A silicon carbide coated body obtainable by a process according to any of the preceding embodiments or according to embodiment [18] to [20], wherein the deposited SiC comprises at least 90%, preferably at least 95%, more preferably at least 97% substantially stoichiometric tetrahedral crystalline SiC.

[22] A silicon carbide coated body obtainable by a process according to any of the preceding embodiments or according to embodiment [18] to [21], wherein the amount of free Si in the deposited SiC comprises not more than about 7 wt. %, preferably not more than about wt. 5%, more preferably not more than about 3 wt. % free Si.

[23] The use of a dimethyldichlorosilane precursor material as defined in anyone of the embodiments [1] to [16] in a chemical vapor deposition (CVD) method for depositing silicon carbide (SiC) on a porous graphite substrate.

[24] The use according to embodiment [23], wherein the porous graphite substrate is characterized as defined in embodiment [17].

[25] The use according to embodiment [23] and [24] for manufacturing articles for high temperature applications, susceptors and reactors, semiconductor materials, wafer.

DETAILED DESCRIPTION OF THE INVENTION

I. Definitions

In the following description given ranges include the lower and upper threshold values. Accordingly, a definition in the sense of "in the range of X and Y" or "in the range between X and Y" of a parameter A means, that A can be any value of X, Y and any value between X and Y. Definitions in the sense of "up to Y" or "at least X" of a parameter A means, that accordingly A may be any value less than Y and Y, or A may be X and any value greater than X, respectively.

According to the present invention the term "about" in connection with a numeric value means to include a variance of ±10%, preferably ±8%, preferably ±5%, preferably ±3%, ±2%, ±1%.

According to the present invention the term "substantially" in connection with a described feature means that this feature is realized to a significant level and/or predominantly without being limited to a complete and absolute realization thereof.

In the present invention the term "dimethyldichlorosilane", having the formula $(CH_3)_2SiCl_2$, is usually abbreviated as DMS. DMS $((CH_3)_2SiCl_2)$ can also be designated as chlorodimethylsilane.

In the sense of the present invention the term "tendril" or "tendrils" describes deposited SiC material, having a specific length and extending from the surface of a porous substrate into the pores, thereby providing a deep-reaching anchor- or hook-like solid connection between an outer SiC layer extending over the surface of a porous substrate with the porous substrate. Tendrils in the sense of the present invention exhibit a root-like or network-like morphology and appear elongated and branched and may look like tree roots with knotlike voids formed in the graphite. They are formed by growing of substantially tetrahedral SiC crystals with low content of amorphous SiC to a tightly connected crystalline SiC material extending with a length of at least 50 µm. This can e.g. be determined by SEM evaluation as illustrated in FIGS. 5a, 5b, 6a and 6b (tendril formation) and FIG. 10 or via XRD pattern according to conventional methods as illustrated in FIG. 11 (substantially tetrahedral SiC crystal structure).

The term "crystallinity", or "crystal(s)" referring to crystallinity/crystals obtained in the process according to the present invention usually means "beta SiC" and/or "(substantially) tetrahedral crystals" as described herein.

A tetrahedral crystal structure is also illustrated in FIG. 10 below.

In the sense of the present invention "porosity" usually relates to "open porosity", otherwise the growing of the SiC tendrils into the porous graphite substrate would not be possible.

Scanning Electron Microscope (SEM) measurement, as mentioned in the present invention as a determination method e.g. for determination of porosity degree, pore modification, SiC particle sizes, interfacial layer thickness etc., preferably relates to a SEM system using Phenom ProX (5 kV, 10 kV and 15 kV) at room temperature (appr. 24° C.).

II. Process

A first aspect of the invention relates to the process for manufacturing a silicon carbide (SiC) coated body by depositing SiC in a chemical vapor deposition method using dimethyldichlorosilane (DMS) as the silane source on a graphite substrate.

1. Process for Preparing the Graphite Substrate

One aspect of the process of the present invention relates to the preparation of the graphite member used in said process as the graphite substrate.

The graphite substrate, that will form the basis or core of the SiC coated element can be prepared from any suitable graphite element, e.g. by cutting into the desired size and shape.

Preferably a graphite is used having at least 99% purity.

The graphite may then be subjected to further treatments, such as in particular a surface treatment for applying a specific surface structure (machining of the graphite). The surface structure can have variable design and may be applied according to the customers' needs and wishes. The surface structure can be applied using conventional methods known in the art.

The thus pre-treated graphite member forms the so-called graphite pre-product.

According to the present invention it is particularly preferred to use a graphite substrate having an open porosity.

The graphite substrate preferably comprises small pores, preferably with an average pore size (pore diameter) in the range of 0.4-5.0 µm. The graphite substrate with the small pores preferably comprises pores with a surface pore diameter of <10 µm. This means, that substantially or the predominant amount of pores exhibits a pore size or diameter of <10 µm. An exemplary embodiment of a suitable graphite pre-product is illustrated in FIG. 7a-c.

It is further preferred to use a graphite substrate having a porosity degree of ≥6% and ≤15%. Preferably, the graphite used in the process of the present invention has a porosity degree of about 6% to about 13%, preferably of about 11% to about 13%. Even more preferred is a graphite substrate having an open porosity with a porosity degree of 6% to 15%, preferably of ≥6% and <15%, preferably of 6% to 13%, more preferably of 6 to <12%, more preferably of 9 to 11.5%.

It if further preferred to use a graphite substrate of fine grain type, super fine grain type and/or ultra fine grain type. Such graphite grain types indicate graphite having particularly fine grain sizes. Preferably, the graphite substrate comprises an average grain size of <0.05 mm, more preferably the grain size is ≤0.04 mm, preferably ≤0.03 mm, preferably ≤0.028 mm, preferably ≤0.025 mm, preferably ≤0.02 mm, preferably ≤0.018 mm, preferably ≤0.015 mm.

The graphite substrate preferably has a density of ≥1.50 g/cm$^3$, preferably ≥1.70 g/cm$^3$, preferably ≥1.75 g/cm$^3$.

The grain size, pore size/pore diameter and the porosity degree can be determined using known methods, such as in particular by SEM (scanning electron microscope) measurement as indicated above.

The porosity can also be obtained by calculating the product of the amount of pores per unit weight [cm$^3$/g] of the graphite substrate and the bulk density [g/cm$^3$]. Accordingly, the porosity can be expressed on a volume basis as [vol/vol].

The (bulk) density can be obtained by dividing the mass of a graphite sample by the volume of said sample.

The amount of pores per unit weight can further be measured with a mercury porosimeter under well-known conditions and using conventional apparatus or as described e.g. in US2018/0002236 A1.

Said desired porosity degree and/or density can already be present in the graphite used for preparing the graphite pre-product. The desired characteristics can also be adjusted in the process steps of the present invention as described herein.

The above defined characteristics are advantageous with respect to the mechanical strength of the graphite substrate and the SiC coated graphite body. With increasing porosity the density of the substrate decreases, which weakens the substrate material and may lead to cracks and defects or abrasion in high temperature applications or during the high temperature CVD process.

However, if the porosity degree and pore size is too small, it becomes difficult to introduce the silane source deeply into the pores to form the SiC tendrils therein. It is thus a further object of the present invention to find the proper balance between good mechanical and physical strength and stability on the one hand and suitability for introducing SiC deeply into the pores of the used graphite substrate material and to identify proper process conditions which allow deposition of SiC of high quality deeply inside the pores of a graphite substrate without deteriorating the mechanical properties of the substrate to provide improved SiC coated articles for high temperature applications.

2. Purification of the Graphite

A further process step relates to a further pre-treatment of the graphite pre-product. Therein, the graphite pre-product is subjected to a purification and chlorination procedure. Therefore, the individual elements of the graphite pre-product are stacked into a furnace and purged with nitrogen gas under heating to reach about 2000° C. Chlorine gas is purged into the furnace to carry out the chlorination of the graphite pre-product. In principle methods for purifying carbonaceous materials such as graphite to remove metal element impurities by chlorination treatment are well known, e.g. from U.S. Pat. No. 2,914,328, WO 94/27909, EP 1522523 A1, EP1375423 or U.S. Pat. No. 4,892,788. In the known chlorination treatments argon is often used as the purge gas with the particular aim to reduce the nitrogen content in the graphite material. None of said documents describes the influence of the process conditions described therein on the porosity of the purified substrates.

However, the inventors of the present invention have found, that in one particular aspect of the present invention by applying very specific process conditions, not only purified graphite members can be prepared, but also graphite members having a modified surface porosity. Such purified graphite members with modified surface porosity turned out to be particularly suitable for the use as graphite substrate in a CVD method according to the present invention, as such modified graphite members particularly facilitated the formation of the SiC tendrils in the pores of the graphite substrate as described herein. In particular under the aspect of keeping the balance between graphite with small pores and low porosity degree for maintaining maximum mechanical strength of the substrate but at the same time having sufficient porosity to allow introduction of the silicon raw material deeply into the pores for SiC deposition and tendril formation inside the graphite the activated and modified surface porosity resulting from the purification and activation step according to the present invention turned out as surprisingly effective.

Therefore, one aspect of the present invention relates to a process for manufacturing a purified graphite member with a modified surface porosity. Such process comprises the specific process steps a) providing a graphite member (e.g. the above mentioned graphite pre-product) having an open porosity and comprising pores with an average pore size (pore diameter) in the range of 0.4-5.0 µm and comprising pores with a surface pore diameter of <10 µm, and having an average grain size of <0.05 mm;

b) purging the graphite member with nitrogen in a furnace until the oxygen content in the furnace is about 5.0%;

c) heating the porous graphite member in the furnace to a temperature of at least about 1000° C.;

d) continuing purging with nitrogen and heating of the porous graphite member until the oxygen content is ≤0.5%;

e) directly subjecting the porous graphite member to a chlorination treatment, by f) increasing the temperature to >1500° C. and start purging chlorine gas;

g) heating the porous graphite member in the chlorine atmosphere to a temperature of ≥1700° C.

Surprisingly, it turned out that with such specific process conditions it is possible to provide a purified graphite member, having a modified surface porosity. Said surface porosity modification becomes apparent compared to the surface porosity of the graphite member according to step a), i.e. a graphite member prior to the treatment according to steps b) to g). The modification can be determined e.g. in microphotographs or by SEM (scanning electron microscope) measurement as indicated above and as illustrated in FIGS. 7a, 7b and 7c showing the porosity of a graphite member according to step a), i.e. prior to the treatment according to steps b) to g) and in FIGS. 8a, 8b and 8c clearly showing the modified surface porosity of said graphite member after the steps b) to g). With the described process the surface porosity is modified, e.g. by enlarging the surface pores to obtain a graphite substrate with modified porosity comprising pores with an average pore size (pore diameter) which is enlarged compared to the graphite substrate used in step a).

In particular, a graphite substrate with modified porosity comprising pores with an average pore size (pore diameter) which is enlarged compared to the graphite substrate used in step a) and comprising pores with a surface pore diameter of ≥10 µm can be obtained.

Preferably, a graphite substrate with modified porosity comprising pores with an average pore size (pore diameter) which is enlarged by the factor 1.2 to 2.0, preferably by the factor 1.2, preferably 1.3, preferably 1.5, preferably 2.0, compared to the graphite substrate used in step a) can be obtained.

Preferably, a graphite substrate with modified porosity comprising pores with a surface pore diameter of ≥10 µm, preferably of ≥10 µm up to 30 µm can be obtained.

Preferably, a graphite substrate with modified porosity comprising pores with an enlarged surface pore diameter which is enlarged by the factor 2.0, preferably by the factor 3.0, preferably by the factor 4.0, preferably by the factor 5.0, preferably by the factor 6.0, preferably by the factor 7.0, preferably by the factor 8.0, preferably by the factor 9.0, preferably by the factor 10.0, compared to the graphite substrate used in step a) can be obtained.

Preferably said modification leads to enlarging the surface pore diameter of the graphite pores, which means that the entrance of the pores is extended and thus provides a kind of entry or funnels or cones, which supports leading the Si gas deeply inside the pores of the porous graphite member. This has the advantage, that the entry for the Si gas is large whereas the overall porosity of the graphite remains small to maintain the mechanical stability and strength of the material.

Accordingly, enlarged surface pore diameters according to the present invention can also mean enlarged at the surface of the substrate relative to the diameter of the pores inside the substrate.

The process steps b) to d) are thus controlled to achieve the above described surface porosity modifications.

In particular, such surface porosity modification comprises enlarging the open pore diameter in the graphite surface compared to the open pore diameter of the graphite member according to step a). With such specific process conditions the average open pore diameter in the graphite surface can be increased for at least 25%, preferably for at least 30%, preferably for at least 35%, preferably for at least 40%, preferably for at least 45%, preferably for at least 50%, preferably for at least 55%, preferably for at least 60%. In particular the average open pore diameter in the graphite surface can be increased for more than 60%, such as e.g. for 60 to 100%. Such surface porosity modification provides a modified surface structure, which promotes and supports the formation of SiC tendrils growing into and extending into the pores of the graphite member, when used in a CVD method according to the present invention.

In step b) nitrogen is preferably purged until the oxygen content in the furnace is about 3.0%, preferably about 2.5%. If the oxygen content in step b) is higher than defined herein before heating the porous graphite member in step c) the graphite burns off and the pore structure is at least partly destroyed. If the oxygen content in step b) is lower than defined herein before heating the porous graphite member in step c), then no sufficient modification of the surface porosity can be achieved.

The oxygen content can be controlled using an oxygen/carbon monoxide meter Bacharach Model 0024-7341.

Preferably, the temperature in step c) and d) is between >1000 and 1500° C., preferably between 1000 and 1200° C.

In step d) purging with nitrogen and heating is preferably continued until the oxygen content is reduced to ≤0.3%, preferably ≤0.2%, preferably ≤0.1%.

It is also possible to purge with nitrogen without starting to heat the graphite member until the desired low oxygen content is reached and then start heating the porous graphite member as defined in step c) above.

The process steps b) to d) are carried out as long until the defined oxygen contents have been achieved.

Without being bound to theory it is assumed that the purge gas nitrogen and oxygen residues being present in the furnace react to form nitrogen oxides (NOx) during combustion, which are known for their reactivity, and which are thus assumed to further effect a purification of the porous graphite member.

In one aspect of the specific process described herein, the graphite member having been purged and optionally heated until the desired low oxygen content has been achieved is directly subjected to the chlorination process by starting to heat the graphite member as defined in step f).

In step f) and/or g) the chlorine gas is preferably purged with 5 to 20, preferably 7 to 10 slpm slpm (standard liter per minute) chlorine gas. The flow meter for controlling the flow of chlorine gas can be a flow meter of Sierra Instruments Digital MFC.

Preferably, the chlorination treatment of steps e) to g) is carried out for a time period of about 1 to 4 hours, preferably 1 to 3 hours.

In step g) the temperature is raised to ≥1700° C. It may also be raised to ≥2000° C. Preferably, the chlorination treatment of steps e) to g) is carried out at a temperature of not more than 2600° C., preferably the temperature in step g) is raised to >1800 and ≤2600° C., preferably to 1800 to 2500° C.

Preferably, the chlorination treatment is controlled to adjust a chlorine content in the porous graphite member to an amount of at least about 20.00 ppb wt., preferably at least about 40.00 ppb wt., preferably at least about 60.00 ppb wt.

In a further aspect, the chlorine content in the porous graphite member is adjusted to an amount of at least about 30.00 ppb wt., preferably at least about 40.00 ppb wt., preferably at least about 50.00 ppb wt.

In a further aspect, the chlorine content in the porous graphite member is adjusted to an amount in the range of about 20.00 to 250.00 ppb wt., preferably of about 30.00 to 250.00 ppb wt., preferably of about 40.00 to 250.00 ppb wt., preferably of about 50.00 to 250.00 ppb wt.

In a further aspect, the chlorine content in the porous graphite member is adjusted to an amount in the range of about 20.00 to 250.00 ppb wt., preferably of about 20.00 to 200.00 ppb wt., preferably of about 20.00 to 175.00 ppb wt., preferably of about 20.00 to 165.00 ppb wt.

Such chlorine content adjustment is particularly preferred in the above described process with the process steps e) to g).

Therein, the adjusted and above defined chlorine content is in particular achieved in the deeper regions of the porous graphite member and not only in the surface region. Very particularly, with the chlorination treatment according to the present invention the above defined preferred chlorine contents can be achieved inside the porous graphite member, in particular in a depth of ≥50 μm below the main surface. The chlorination content in the depth of the graphite member is preferred to achieve the desired degree of purity and to introduce chlorine into the graphite member.

Said adjustment can in particular be achieved with the aforesaid preferred chlorination treatment conditions.

Without being bound to theory it is assumed that introducing chlorine into the graphite member provides a kind of reservoir of entrapped chlorine, which can achieve a further purification in following process steps as described herein, e.g. in a CVD method as described herein. To introduce and preserve residual chlorine in the graphite member the specific porosity degree and/or density of the graphite member as defined herein is assumed as advantageous. It is assumed, that such comparably dense graphite materials support the entrapping of the chlorine in the graphite member.

According to the present invention the chlorination treatment is carried out to provide a purified porous graphite member, e.g. a graphite member resulting from the above described process step g), comprising one or more of the following impurity elements in an amount of
  calcium<100.00 ppb wt.,
  magnesium<100.00 ppb wt.,
  aluminum<100.00 ppb wt.,
  titanium<20.00 ppb wt.,
  chromium<200.00 ppb wt.,
  manganese<20.00 ppb wt.,
  copper<100.00 ppb wt.
  iron<20.00 ppb wt.,
  cobalt<20.00 ppb wt.,
  nickel<20.00 ppb wt.,
  zinc<100.00 ppb wt.,
  molybdenum<300.00 ppb wt.;
  preferably comprising one or more of the following impurity elements in an amount of
  calcium<50.00 ppb wt.
  magnesium<50.00 ppb wt.
  aluminum<50.00 ppb wt.
  titanium<10.00 ppb wt.,
  chromium<100.00 ppb wt.
  manganese<10.00 ppb wt.
  copper<50.00 ppb wt.
  iron<10.00 ppb wt.
  cobalt<10.00 ppb wt.
  nickel<10.00 ppb wt.,
  zinc<50.00 ppb wt.,
  molybdenum<150.00 ppb wt.

According to the present invention the chlorination treatment is carried out to provide a porous member having a purity of ≥98%, preferably ≥99%.

The purification process according to the present invention preferably provides a porous graphite member having a total amount of impurities of ≤10.00 ppm wt., preferably ≤5.00 ppm wt., preferably ≤4.00 ppm wt.

The above described process of purification or purification and surface modification may further comprise a step of annealing the porous graphite member, thereby maintaining the porous graphite member at a temperature of >1000° C. for reducing stress in the porous graphite member.

The resulting purified porous graphite member can be subjected to a surface cleaning, thereby removing dust and loose particles from the surface of the treated graphite member.

In the known chlorination treatments of graphite it is quite usual to use argon as purge gas. The inventors of the present invention surprisingly found, that in particular for the preparation of purified graphite members to be used in a CVD method as described herein, wherein the formation of tendrils extending into the pores of the graphite is intended, argon is not suitable as purge gas. In contrast, the inventors found that no tendril formation occurs, if argon has been used as purge gas in the process of purifying the graphite members. In a further aspect of the invention it is thus preferred to carry out the purification and chlorination process in the absence of argon.

3. Activation of the Chlorinated Graphite

A further process step relates to a further pre-treatment of a graphite pre-product or of the purified and chlorinated graphite member described above. Therein, the graphite pre-product or the purified, chlorinated graphite member described above is subjected to an activation procedure. The inventors of the present invention surprisingly found, that in one further aspect of the present invention the application of very specific process conditions are suitable to prepare an activated graphite member with (further) modified surface porosity. Such activated graphite members with modified surface porosity turned out to be particularly suitable for the use as graphite substrates in a CVD method according to the present invention, as such activated graphite members further facilitate and support the formation of SiC tendrils extending into the pores of the graphite, when used in a CVD method as described hereinafter.

Accordingly, a further aspect of the present invention relates to a process for manufacturing an activated graphite substrate with a modified surface porosity. Such process comprises the specific process steps i) positioning a graphite substrate having an open porosity and comprising pores with an average pore size (pore diameter) in the range of 0.4-5.0 µm and comprising pores with a surface pore diameter of <10 µm, and having an average grain size of <0.05 mm in a process chamber;

ii) purging the graphite substrate with nitrogen in the process chamber until the oxygen content in the process chamber is about 5.0%;

iii) heating the porous graphite substrate in the furnace to a temperature of at least about 1000° C.;

iv) continuing purging with nitrogen and heating of the porous graphite substrate to a temperature of >1000° C. until the oxygen content is ≤0.5%.

Such process can be carried out in a process chamber, cladded with graphite. The process chamber may comprise holding elements, onto which the graphite elements to be treated can be mounted. It is preferred to keep the point(s) of contact between the graphite elements and the holding elements as small as possible. The process chamber may be heated. In principle, such process chambers are known.

Said process may further comprise a step v) of annealing the activated porous graphite substrate by maintaining the activated porous graphite substrate at a temperature of >1000° C. for reducing stress in the activated porous graphite substrate following step iv).

The activated porous graphite substrate may be cleaned from surface dust or loose particles. However, it is particularly preferred, that the activated porous graphite substrate obtained by said activation process is directly subjected to a chemical vapor deposition treatment, such as described hereinafter. Accordingly, the aforesaid process preferably comprises a further step vi), following step iv) or the optional step v), of directly subjecting the activated porous graphite substrate to a CVD treatment. Therein, it is particularly preferred to omit any cleaning steps between the activation treatment and the CVD treatment, such as described e.g. in U.S. Pat. No. 3,925,577.

Accordingly, a further aspect of the present invention relates to a process for manufacturing an activated graphite substrate with a modified surface porosity, which comprises the specific process steps i) positioning a graphite substrate having an open porosity and comprising pores with an average pore size (pore diameter) in the range of 0.4-5.0 µm and comprising pores with a surface pore diameter of <10 µm, and having an average grain size of <0.05 mm in a process chamber;

ii) purging the graphite substrate with nitrogen in the process chamber until the oxygen content in the process chamber is about 5.0%;

iii) heating the porous graphite substrate in the furnace to a temperature of at least about 1000° C.;

iv) continuing purging with nitrogen and heating of the porous graphite substrate to a temperature of >1000° C. until the oxygen content is ≤0.5%;

v) optionally annealing the activated porous graphite substrate resulting from step iv) at a temperature of >1000° C. to reduce stress in the activated porous substrate;

vi) directly subjecting the activated porous graphite substrate of step iv) or v) to a CVD treatment without prior cleaning step.

In one aspect of the invention, such activated porous graphite substrate being directly subjected to a CVD process without removing dust or loose particles may comprise a kind of powder layer on the surface, such surface powder layer then mainly comprises carbon powder or carbon dust. The porous graphite substrate resulting from step iv) or v) may comprise such a surface powder layer having a thickness of 1 to 15 µm, preferably of >2 to 10 µm, preferably of >3 to 7 µm, preferably of >1 µm, preferably of >2 µm. Accordingly, the activated porous graphite substrate being directly subjected to CVD treatment in step vi) preferably exhibits a respective surface powder layer.

Such loose powder layer surprisingly turned out to positively influence the SiC coating in the CVD process. Without being bound to theory, it is assumed that the loose powder layer provides an improved nucleation surface to enhance growth of the crystalline SiC and further accelerates the SiC formation.

In step ii) of the activation process described above preferably nitrogen is purged until the oxygen content in the process chamber is about 3.0%, preferably about 2.5%. In step iv) purging with nitrogen and heating is preferably continued until the oxygen content is reduced to ≤0.3%, preferably ≤0.2%, preferably ≤0.1%.

The oxygen content can be controlled using an oxygen/carbon monoxide meter Bacharach Model 0024-7341.

Similar as in the purification process described above, an oxygen content in step ii) being higher than defined herein before heating the porous graphite member in step iii) is critical. With a higher oxygen content the graphite may burn off and the pore structure is at least partly destroyed. If the oxygen content in step ii) is lower than defined herein before heating the porous graphite member in step iii), then no sufficient activation of the graphite substrate can be achieved.

Preferably, the temperature in step iii) and iv) is between >1000 and 1500° C., preferably between 1000 and 1200° C.

The process steps ii) to iv) are carried out as long until the defined oxygen contents have been achieved.

Very preferably a purified and chlorinated graphite member as described above is subjected to the present activation treatment. Therefore, it is particularly preferred that in said activation process the graphite substrate of step i) exhibits a chlorine content of at least about 20.00 ppb wt., preferably at least about 40.00 ppb wt., preferably at least about 60.00 ppb wt.

In a further aspect, the chlorine content in the porous graphite substrate used in step i) is at least about 30.00 ppb wt., preferably at least about 40.00 ppb wt., preferably at least about 50.00 ppb wt.

In a further aspect, the chlorine content in the porous graphite substrate used in step i) is in the range of about 20.00 to 250.00 ppb wt., preferably of about 30.00 to 250.00 ppb wt., preferably of about 40.00 to 250.00 ppb wt., preferably of about 50.00 to 250.00 ppb wt.

In a further aspect, the chlorine content in the porous graphite substrate used in step i) is in the range of about 20.00 to 250.00 ppb wt., preferably of about 20.00 to 200.00 ppb wt., preferably of about 20.00 to 175.00 ppb wt., preferably of about 20.00 to 165.00 ppb wt.

Very particularly, said preferred chlorine contents are present inside the porous graphite substrate, in particular in a depth of ≥50 μm below the main surface.

As mentioned above, using graphite substrate with such chlorine contents entrapped inside the graphite substrate are advantageous to achieve a further purification during the present activation treatment.

For the reasons set out above, the porous graphite substrate of step i) of the activation process preferably has a pore characteristic as defined above, such as in particular the above defined small average pore size (diameter) and the low porosity degree.

For the reasons set out above, the porous graphite substrate of step i) of the activation process preferably has a porosity degree as defined above.

For the reasons set out above, the porous graphite substrate of step i) of the activation process preferably has a grain size and/or density as defined above.

The porous graphite substrate being treated in the activation treatment descried herein can be further purified to the entrapped chlorine content, as explained above. Accordingly, the activated porous graphite substrate resulting from the above described process may comprise one or more of the following impurity elements in an amount of
calcium<100.00 ppb wt.,
magnesium<100.00 ppb wt.,
aluminum<100.00 ppb wt.,
titanium<20.00 ppb wt.,
chromium<200.00 ppb wt.,
manganese<20.00 ppb wt.,
copper<100.00 ppb wt.
iron<20.00 ppb wt.,
cobalt<20.00 ppb wt.,
nickel<20.00 ppb wt.,
zinc<100.00 ppb wt.,
molybdenum<300.00 ppb wt.

preferably comprising one or more of the following impurity elements in an amount of
calcium<50.00 ppb wt.
magnesium<50.00 ppb wt.
aluminum<50.00 ppb wt.
titanium<10.00 ppb wt.,
chromium<100.00 ppb wt.
manganese<10.00 ppb wt.
copper<50.00 ppb wt.
iron<10.00 ppb wt.
cobalt<10.00 ppb wt.
nickel<10.00 ppb wt.
zinc<50.00 ppb wt.,
molybdenum<150.00 ppb wt.

The activated porous graphite substrate may have a purity of ≥98%, preferably ≥99%.

The activated porous graphite substrate may further have a total amount of impurities of ≤10.00 ppm wt., preferably ≤5.00 ppm wt., preferably ≤4.00 ppm wt.

If the activated porous graphite substrate is directly subjected to a chemical vapor deposition treatment, such CVD treatment can be carried out in the same process chamber. Then, the introduction of $H_2$ can already be started, if the temperature in the process chamber is >1000° C. and the oxygen content in the process chamber is below 1.5%. For example, the process step 2) of the CVD method described below can already start, if such oxygen content of below 1.5% is reached in the process chamber.

With said activation process the above described surface pore modifications with the enlarged surface pore diameters as defined above can be achieved.

It turned out that accordingly treated graphite substrates are particularly suitable to support SiC tendril formation in a CVD method using DMS as described herein and to provide an improved substrate for the CVD method as described herein.

4. Silicon Carbide (SiC) Deposition on Porous Graphite Substrates by Chemical Vapor Deposition (CVD)

A further process step relates to the deposition of SiC on porous graphite substrates. Preferred porous graphite substrates are purified and chlorinated graphite members resulting from the purification process described above, as well as activated graphite substrates resulting from the activation process described above, which exhibit the modified enlarged surface porosity.

A key element of the process of the present invention is the formation of the interfacial layer with the SiC filling of the pores of the porous graphite substrate and the subsequent deposition of SiC to form an outer silicon carbide layer on the porous graphite substrate, which is achieved by chemical vapor deposition of dimethyldichlorosilane. In principle, the chemical vapor deposition ("CVD", also known as chemical vapor phase deposition "CVPD") is a well-known technique used to produce high quality, high-performance, solid materials, such as in particular to produce thin films in the semiconductor industry. Typically, a substrate is exposed to one or more volatile precursors, which react and/or decompose on the substrate surface to produce the desired deposit. CVD is commonly used to deposit silicon, silicon dioxide, silicon nitride as well as silicon carbides. Therein, a wide variety of organosilanes can be used as the volatile CVD precursor, including simple organosilanes, which may be substituted by one or more halogen atoms, such as mono-, di-, tri- and tetramethyl silane and chlorosilanes, including e.g. methyldichlorosilane, methyltrichlorosilane, tetrachlorosilane ($SiCl_4$), dimethyldichlorosilane, as well as arylsilanes, which may be substituted by halogen atoms. The most common CVD precursor for depositing silicon carbide are trichlorosilane, tetrachlorosilane and methyltrichlorosilane.

As described e.g. by D. Cagliostro and S. Riccitiello (1990) and by Byung Jin Choi (1997), both cited above, the characteristics and the quality of the deposited SiC material as well as its behavior in the CVD process strongly depends from the kind of selected organosilane precursor material and from the specific CVD process conditions applied. As described e.g. by D. Cagliostro and S. Riccitiello (1990) the volatility, transport properties and reaction kinetics of the fractions formed from the precursor material affect the ability to penetrate, condense in and/or coat porous media and therefore affect morphology, densification and/or mechanical properties. As further described in US2018/002236 cited above also the proper selection of the porous substrate material is critical to achieve Si infiltration into the pores. Too small porosity impairs the introduction of the Si raw material into the deeper regions of the porous substrate whereas too big pores deteriorate the mechanical strength of the substrate. Byung Jin Choi (1997) further illustrates the influence on the characteristics and quality of the deposited SiC material by varying the specific process conditions (e.g. CVD temperature) and by using different organosilane CVD precursor materials.

The inventors of the present invention have surprisingly found that the advantageous product characteristics as described herein can be achieved with the new process of the present invention by using dimethyldichlorosilane (DMS), as the CVD precursor. It turned out that with the specific selection of dimethyldichlorosilane (DMS) as the CVD precursor instead of e.g. the more common tetrachlorosilane, trichlorosilane or methyltrichlorosilane (MTS, trichloromethylsilane) in the new process of the present invention it is possible to achieve the improved characteristics of the SiC material deposited on porous graphite to form the improved SiC coated articles as described herein. The new and improved SiC coated articles are e.g. characterized by the hereinafter described improved SiC material with the specific SiC grain and crystal size and substantially tetrahedral crystallinity with reduced contents of amorphous SiC, which improves the strength and hardness of the deposited SiC, the specific SiC tendril formation and the pore filling degree as described herein, with the formation of the interfacial layer with the described thickness and the improved outer SiC coating layer, which is tightly connected with the SiC tendrils, thus providing improved mechanical properties, homogeneity and continuity etc.

Accordingly, one further aspect of the present invention relates to a CVD process with very specific CVD process conditions, being suitable to provide a new and improved SiC coating and thus new and improved SiC coated bodies.

Concretely, the inventors of the present invention found, that only the specific CVD conditions of using dimethyldichlorosilane (DMS) as the silane source or CVD precursor in the presence of $H_2$ as the purge gas for depositing SiC on a graphite substrate having an open porosity leads to the formation of SiC tendrils, which grow into the porous structure of the porous graphite substrate, thus extending into the graphite substrate. Such SiC tendrils are characterized by substantially tetrahedral SiC crystals (as shown e.g. in FIG. 10) forming a tightly connected crystalline SiC material in the form of root-like tendrils extending with a length of at least 50 μm into the porous graphite substrate. As mentioned above, the improved SiC material deposited under the specific conditions of the CVD process of the present invention are characterized by being predominantly formed as crystalline beta SiC (see e.g. FIG. 11) forming tetrahedral crystals (see e.g. FIG. 10) and comprising low amounts of amorphous SiC, which is illustrated by the XRD pattern of FIG. 11 with the very sharp beta SiC peak (111). The SiC tendrils are further tightly connected with an overlying SiC surface coating as shown e.g. in FIG. 6b (reference sign (7)). This effects improved connectivity of the SiC surface layer with the graphite substrate and reduced exfoliation, peeling or warpage.

This allows to deposit a SiC coating on the porous graphite substrate with enhanced mechanical properties, such as improved mechanical properties, such as a tight connection (adhesion) of the SiC coating layer to the underlying substrate, high etch resistance, impact resistance, fracture toughness and/or crack resistance of the SiC coating as well as oxidation resistance of the coated body, as well as improved homogeneity of the SiC coating.

Accordingly, a further aspect of the present invention relates to a process for manufacturing a silicon carbide (SiC) coated body (or article), such process comprising the steps 1) positioning a porous graphite substrate having an open porosity with a porosity degree of 6% to 15% and comprising pores with a surface pore diameter of 10 to 30 μm in a process chamber;
2) heating the porous graphite substrate in the process chamber to a temperature in the range of 1000 to 1200° C. under atmospheric pressure in the presence of $H_2$ as purge gas;
3) introducing a mixture of dimethyldichlorosilane (DMS) and $H_2$ into the process chamber for at least 30 minutes;
4) depositing in an infusion phase crystalline SiC grains in the open pores of the graphite substrate by chemical vapor deposition (CVD) and allow growing of crystalline SiC grains to substantially tetrahedral SiC crystals until a connected crystalline SiC material in the form of tendrils extending with a length of at least 50 μm into the porous graphite substrate is formed;
5) optionally continuing the chemical vapor deposition until a SiC surface layer of up to 50 μm thickness, which comprises substantially tetrahedral SiC crystals, is deposited on the surface of the graphite substrate in a first growth phase;
6) cooling the body resulting from step 5).

Preferably, in step 2) the temperature is 1000 to <1200° C., more preferably 1100 to 1150° C. As can be seen in FIG. 9 the selection of the proper temperature range in the CVD process influences the SiC crystallization by influencing the rate of crystal growth and the rate of homogeneous nucleation. In the optimum temperature range (shaded area in FIG. 9) the balance between crystal growth and homogeneous nucleation is properly balanced and the substantially tetrahedral crystalline SiC with the herein defined crystal size and the formation of the tendrils can be achieved. FIG. 9 further shows that too high temperatures lead to melting and the formation of metastable material (amorphous SiC). The proper temperature range with the well balanced rate of crystal growth and homogeneous nucleation has to be determined individually depending from the further process conditions such as in particular from the selection of the organosilane source used as the CVD precursor.

Also the pressure conditions influence said balance of rate of crystal growth and homogeneous nucleation. Low pressure supports low deposition rates and favors for less and large nuclei. The inventors of the present invention found atmospheric pressure to be suitable to achieve the effects described herein.

The inventors further found, that the formation of tendrils depends from the CVD deposition time. Accordingly, in step 3) the mixture of dimethyldichlorosilane (DMS) and $H_2$ is introduced into the process chamber for >30 minutes. Preferably, the mixture of dimethyldichlorosilane (DMS) and $H_2$ is introduced for a period of >30 minutes and <12 hours, preferably >45 minutes and <10 hours, more preferably for at least one hour, more preferably for <10 hours, preferably <8 hours, preferably <6 hours, preferably <4 hours, preferably <3 hours, most preferred within 1 to 2 hours. Within shorter times it is hardly possible to achieve the formation of tendrils according to the present invention. Larger times become disadvantageous under process economic considerations.

It is further preferred, that in the process of the present invention the chemical vapor deposition (CVD) is carried out with a total flow rate of the mixture of DMS and $H_2$ of 25 to 200 slpm, preferably 40 to 180 slpm, more preferably 60 to 160 slpm.

It is particularly preferred to deposit not only SiC tendrils in the pores of the graphite, but also a SiC coating on top of the surface of the graphite substrate with the SiC filled pores. Therefore, step 5)—although not mandatory—is preferably also carried out. Certainly, step 5) can be controlled to achieve a SiC surface layer of the desired thickness, e.g. by varying the deposition time and/or the amount of DMS.

It further turned out, that surprisingly the formation of the SiC tendrils can significantly be improved or facilitated, if prior to step 2) a pre-conditioning step is included, wherein the porous graphite substrate is pre-treated and activated by purging the process chamber with $N_2$ and heating to a temperature 1000° C., preferably of 1000 to 1500° C., and then directly carrying out step 2). In principle such pre-treatment step is very similar to the graphite activation process described above. As mentioned above, the activation process and the CVD method are preferably combined and carried out in the same process chamber. Accordingly, such pre-conditioning step preferably comprises purging the process chamber with nitrogen until the oxygen content in the process chamber is about 5.0%, followed by heating the process chamber to a temperature of at least about 1000° C., preferably of >1000 to 1500° C., preferably of between 1000 and 1200° C., until the oxygen content is ≤0.5%, preferably ≤0.3%, preferably ≤0.2%, preferably ≤0.1%.

The oxygen content can be controlled using an oxygen/carbon monoxide meter Bacharach Model 0024-7341.

As mentioned above, it further surprisingly turned out that the specific porosity with a particular pore size/pore diameter and degree of porosity of the graphite substrate to be coated with SiC by CVD plays an important role to achieve the coated articles with the desired superior mechanical properties, such as a tight connection (adhesion) of the SiC coating layer to the underlying substrate, high etch resistance, impact resistance, fracture toughness and/or crack resistance of the SiC coating as well as oxidation resistance of the coated body. Therefore, the graphite substrate to be coated with SiC should exhibit an open porosity with a small porosity degree of 6% to 15% and should further comprise a sufficient amount of pores having an enlarged surface pore diameter of about 10 to 30 µm to facilitate SiC infiltration.

A graphite substrate to be coated with SiC in the process of the present invention exhibiting a porosity of 6% and 15% turned out to be particularly suitable to achieve the SiC coated articles with the desired properties.

Preferably the graphite substrate to be coated with SiC in the process of the present invention exhibits a porosity of >6% to <15% or a porosity in a range of about 6% to about 14%, about 6% to about 13%, about 6% to <13%, or a porosity in a range of >6% to about 15%, about 7% to about 15%, about 8% to 15%, about 9% to about 15%, about 10% to about 15%, about 11% to about 15%, or a porosity in a range of ≥11% to about 13%. Most preferred is a porosity degree of ≥6% and <15%, preferably 6% to 13%, more preferably 6 to <12%, more preferably 9 to 11.5%. Such preferred ranges are likewise preferred ranges in the purification and chlorination process and the activation process, both as described above, and likewise in the resulting products as described below.

For the reasons described above it is further preferred, that the porous graphite substrate has small pores, such as an average pore size (pore diameter) of 0.4-5.0 µm, preferably 1.0 to 4.0 µm and to comprise pores with an enlarged surface pore diameter of about 10 µm up to 30 µm, preferably up to 20 µm, preferably up to 10 µm.

For the reasons described above it is further preferred, that the porous graphite substrate has a density of ≥1.50 g/cm$^3$, preferably ≥1.70 g/cm$^3$, preferably ≥1.75 g/cm$^3$.

For the reasons described above it is further preferred, that the porous graphite substrate used in step 1) is an activated graphite substrate having a modified surface porosity with enlarged surface pores as described in detail above.

As mentioned above, the degree of porosity, the pore size/diameter or the enlarged surface porosity and the density according to the present invention can be determined as indicated above, e.g. by known methods, including in particular determination of the porosity via SEM measurement.

The term "tendril" or "tendrils" as used in the present invention describes deposited SiC material, which is grown to extend from the surface of the porous substrate into the pores and thus extends from the surface of the porous substrate into the deeper regions thereof, e.g. in tendril-like, root-like or stretched dimension as described already above, thus providing a deep-reaching anchor- or hook-like solid connection of the outer SiC layer extending over the surface of the porous substrate with the porous substrate. To achieve sufficient anchoring the tendrils are allowed to grow into the pores until an average length of at least 50 µm is achieved.

Preferably step 4) is carried out until a connected crystalline SiC material in the form of tendrils extending with an average length of at least 75 µm, preferably at least 100 µm, preferably 75 to 200 µm is formed.

The formation of tendrils, extending into the pores of the graphite substrate, in the process of the present invention the infusion phase of step 4) leads to the formation of a so-called "interfacial layer". The term "interfacial layer" as used in the present invention describes the zone or region, which is located between the porous graphite substrate and the SiC coating layer deposited on the surface of said porous graphite substrate, e.g. in step 5) and/or in step 8) as described below, and which is formed by the porous graphite, wherein the pores are filled with the deposited SiC, i.e. the SiC tendrils, as described herein. Accordingly, the interfacial layer of the SiC coated articles or bodies of the present invention comprises the porous graphite material of the porous graphite substrate with SiC tendrils extending into the pores.

Preferably, step 4) is carried out until an interfacial layer having a thickness of at least 100 μm is formed.

Said interfacial layer extends from the surface of the porous graphite substrate more or less vertically downwards into the porous graphite substrate and thus forms the interfacial layer or region. Said interfacial layer preferably has a thickness of >100 μm, more preferably of at least 200 μm, more preferably of about 200 to about 500 μm.

In step 3) of the present invention the heated porous graphite substrate is subjected to chemical vapor deposition for depositing the silicon carbide in and on the porous graphite substrate. Therein, the mixture of DMS and $H_2$ according to step 3) is preferably obtained by introducing the $H_2$ gas into the DMS tank, bubbling the $H_2$ through the DMS in the tank and passing the mixture of DMS and $H_2$ into the process chamber by pushing the mixture from the top of the tank.

Preferably, the chemical vapor deposition (CVD) is carried out with a total flow rate of the mixture of DMS and $H_2$ of 25 to 200 slpm, preferably 40 to 180 slpm, more preferably 60 to 160 slpm. More preferably, an amount of 25-45 slpm of the mixture is introduced into the process chamber.

Preferably, $H_2$ is directed through the DMS tank and joined with the DMS. A further amount of $H_2$ may be purged directly into the process chamber, where it joins with the mixture of DMS and $H_2$.

The flow meter for controlling the flow of the DMS/$H_2$ mixture can be a flow meter of Sierra Instruments Digital MFC.

Further steps of heating and purging with $H_2$ may be carried out prior to the introduction of the DMS.

As mentioned above, argon is a common purge gas also in CVD methods, however, the inventors found, that no tendril formation occurs when using argon as purge gas in the CVD process of the present invention (or any other process described herein). Therefore, the process is preferably carried out in the absence of argon.

In the preferred further step e) of the CVD process of the present invention a SiC layer is further grown on the porous graphite substrate in a first growth phase by continuing chemical vapor deposition of the mixture of dimethyldichlorosilane and $H_2$, thus covering the graphite substrate surface. As mentioned above, the thickness of such SiC coating can be varied, although a surface layer of up to 50 μm is preferred.

Preferably, the process step 5) is carried out until a SiC surface layer of at least 30 μm, preferably at least 35 μm, preferably at least 40 μm, more preferably at least 45 μm thickness is deposited on the surface of the graphite substrate.

The thus coated SiC graphite substrate may be subjected to a further step of annealing the coated porous graphite substrate by maintaining the coated porous graphite substrate at a temperature of >1000° C. for reducing stress in the SiC coating and in the porous graphite substrate.

Such an annealing step may also be carried out following the pre-conditioning step described above.

Accordingly, such an annealing step can be carried out prior to step 2) and/or, if present, following the pre-conditioning step as described above,
and/or prior to step 6).

Due to the positioning of the graphite substrate elements on holding elements said points of contact are not coated with SiC in the CVD process. Therefore, to achieve a homogenous and continuous SiC coating over the whole surface, the following process steps 7) and 8) may be carried out following step 6):

7) changing the position of the body resulting from step 6); and
8) repeating step 2) and introduction of a mixture of dimethyldichlorosilane (DMS) and $H_2$ into the process chamber in a second growth phase, thereby depositing crystalline SiC grains on the surface of the porous graphite substrate resulting from step 6) by chemical vapor deposition (CVD) and allow growing of the crystalline SiC grains to substantially tetrahedral SiC crystals until an outer SiC surface layer is formed.

Preferably, the second growth phase according to step 8) is carried out applying the same CVD conditions as in the infusion phase and first growth phase. Therefore, in principle the same applies as defined above for the first growth phase.

An annealing step as described above can also be carried out prior to step 8) and/or prior to the cooling step 6). A similar cooling step is carried out after the second growth phase of step 8). Following the cooling steps, the coated bodies are preferably subjected to a quality inspection and optionally a purification, thereby removing loose particles and/or protruding crystals.

However, preferably, the CVD process according to the present invention is controlled, so that the SiC layer deposited onto the graphite substrate in the first growth phase in step 5) is thicker than the SiC layer deposited onto the graphite substrate in the second growth phase in step 8) under the same conditions, in particular with the same DMS amount, and in the same deposition time. This can e.g. be achieved by carrying out the above described pre-conditioning step prior to step 2). This must be considered as surprising, as it would be assumed that applying the same amount of DMS in the same time to the porous graphite of step 1) would lead to a thinner SiC coating in the first growth phase, as before building up the SiC coating DMS is needed for forming the SiC tendrils, which takes some time prior to building up the coating layer. Without being bound to theory it is assumed that the pre-conditioning step provides an activated surface of the graphite substrate, which provides crystallization points for the SiC crystals and thus accelerates and facilitates the SiC formation in the pores and on the graphite surface. Such pre-conditioning step may comprise the process steps i) to v) as described above. It is assumed, that the surface powder layer formed on the graphite substrate in the process steps i) to v) as described above may act as activated surface of the graphite substrate subjected to the CVD treatment in step 1) above.

The powder on the graphite surface may provide said crystallization points for the SiC crystals and accelerate and facilitate the SiC formation.

In the so-called "infusion phase" very small SiC grains form in the open pores of the porous graphite substrate, which are allowed to grow to SiC crystals of beta-SiC with substantially tetrahedral crystallinity to form the so-called "tendrils" within the pores.

After filling the pores, small SiC grains are deposited on the upper surface of the graphite substrate to start buildup of the outer SiC layer in the so-called "growth phase". The small SiC grains are allowed to grow to SiC crystals to form the out SiC layer.

According to the present invention the term "SiC grain" or "SiC grains" refers to very small crystalline particles formed and deposited in the chemical vapor deposition in step 4) and 5) and 8) by using dimethyldichlorosilane and which mainly comprise silicon carbide. Such SiC grains according to the present invention are crystalline and exhibit an average particle size of <2 μm.

In contrast to the above defined SiC grains, according to the present invention the term "SiC crystal" or "SiC crystals" refers to bigger crystalline SiC particles and which are formed in step 4) and 5) and 8) by allowing the deposited SiC grains to grow. Such SiC crystals according to the present invention similarly mainly comprise silicon carbide and exhibit an average particle size of ≥2 µm. Preferably the SiC crystals according to the present invention exhibit an average particle size>2 µm. It is further preferred that the SiC crystals according to the present invention exhibit an average particle size of not more than 30 µm. More preferably the SiC crystals according to the present invention exhibit an average particle size in the range of about ≥2 to ≤30 µm.

The average particle size according to the present invention can be determined by known methods, such as SEM as indicated above.

Accordingly, in a further aspect of the process of the present invention the infusion phase of step 4) is controlled to effect the formation of (crystalline) SiC grains having an average particle size of <10 µm can be observed, such as in particular of ≤7 µm, more particularly of ≤5 µm or even ≤4 µm or ≤3 µm or even ≤2 µm, formed in the pores during the infusion phase. Further, the infusion phase of step 3) is controlled to effect the formation of SiC crystals having an average particle size of not more than 30 µm (≥2 to ≤30 µm), preferably of not more than 20 µm (≥2 to ≤20 µm), preferably of not more than 10 µm (≥2 to ≤10 µm) formed in the pores during the infusion phase by allowing the SiC grains to grow.

In a further aspect of the process of the present invention the first and second growth phase of step 5) and 8) are controlled to effect the formation of (crystalline) SiC grains having an average particle size of <10 µm can be observed, such as in particular of ≤7 µm, more particularly of ≤5 µm or even ≤4 µm or ≤3 µm or even ≤2 µm on the surface of the graphite substrate during the growth phase and allowing the SiC grains to grow to form SiC crystals having an average particle size of not more than 30 µm, preferably having an average particle size of ≥2 to ≤30 µm, preferably of not more than 20 µm (≥2 to ≤20 µm), preferably of not more than 10 µm (≥2 to ≤10 µm) on the graphite substrate during the growth phase to form the outer SiC layer.

A certain amount of SiC grains may also already be formed on the graphite surface during the infusion phase.

Preferably, the substantially tetrahedral SiC crystals in the pores exhibit an average particle size of <10 µm, preferably of ≤7 µm, preferably of ≤5 µm, preferably of ≤4 µm, preferably of ≤3 µm, preferably of ≤2 µm.

Preferably, the substantially tetrahedral SiC crystals formed as the surface coating layer in the growth phase exhibit a larger particle size, preferably an average particle size of ≥10 µm, preferably of ≥10 to 30 µm. This is probably due to the limitation of the crystal growth inside the pores by the space given by the small pore size.

Further, it surprisingly turned out the with the selected process conditions of the present invention the deposited SiC is substantially stoichiometric SiC having a ratio of Si:C of 1:1.

Further, the process according to the present invention is preferably controlled to deposit SiC with a density according to or very close to the theoretical density of SiC, which is 3.21 g/cm$^3$, in the pores and/or on the surface of the graphite substrate. Preferably, the deposited SiC has a density of at least 2.50 g/cm$^3$, preferably the deposited SiC has a density in the range of 2.50 to 3.21 g/cm$^3$, more preferably in the range of 3.00 to 3.21 g/cm$^3$.

In the process according to the present invention the CVD deposition is preferably carried out until the density of tendrils (amount of tendrils per area) formed in the interfacial layer is ≥6 and ≤15%, preferably 6% to 13%, more preferably 6 to ≤12%, more preferably 9 to 11.5%.

According to a further aspect of the present invention it turned out that a comparably high degree of pore filling with the deposited SiC material may be advantageous to achieve the desired superior mechanical properties as described above. Accordingly in a preferred embodiment in the process of the present invention the infusion phase of step 4) is carried out until at least about 70% of the walls of the open pores of the graphite substrate are coated with the deposited SiC material. For sake of clarity it should be noted that this shall not define that 70% of the open porous substrate or 70% of the total amount of the pores of the porous substrate shall be filled with the SiC, neither are 70% of the volume of the pores filled with SiC. The pore filling degree in accordance with the present invention relates to the degree of coating of the inner walls of the open pores, of which preferably at least 70% are coated with a deposited SiC coating.

More preferably, the infusion phase of step 4) is carried out until at least about 75%, 80%, 85%, 90% of the inner walls of the open pores are coated with the deposited SiC material.

In a further aspect, with the CVD method according to the present invention SiC can be deposited on a porous graphite substrate and in the open pores thereof, having a pore filling degree according to the above definition (i.e. a degree of SiC coating of the inner walls of the pores) of ≥80% until a depth of about 10 µm from below the main surface of the coated graphite.

With the CVD method according to the present invention SiC can be deposited on a porous graphite substrate and in the open pores thereof, having a pore filling degree according to the above definition (i.e. a degree of SiC coating of the inner walls of the pores) of still ≤60% in a depth of between about 50 to about 10 µm from below the main surface of the coated graphite.

With the CVD method according to the present invention SiC can be deposited on a porous graphite substrate and in the open pores thereof, having a pore filling degree according to the above definition (i.e. a degree of SiC coating of the inner walls of the pores) of about 50% in a depth of between about 100 to about 50 µm from below the main surface of the coated graphite.

With the CVD method according to the present invention SiC can be deposited on a porous graphite substrate and in the open pores thereof, having a pore filling degree according to the above definition (i.e. a degree of SiC coating of the inner walls of the pores) of about 40% in a depth of between about 200 to about 100 µm from below the main surface of the coated graphite.

In a depth of ≥100 µm the pore filling degree according to the above definition is up to 50%.

In a depth of ≥200 µm the pore filling degree according to the above definition is up to 40%.

The degree of pore filling according to the present invention can be determined by SEM measurement as indicated above.

As mentioned above, a further aspect of the process of the present invention relates to the formation of so called tendrils, which act like an anchor for the SiC coating in the porous substrate.

The process of the present invention is in particular controlled to deposit in step 5) and 8) a SiC coating layer in the form of a homogeneous and continuous, essentially impervious layer onto the surface of the graphite substrate. This means, that the SiC coating layer is in particular deposited to be essentially free of cracks, holes, spellings or other noticeable surface defects and exhibits essentially a continuous thickness over the whole coated surface area (despite the lacks of coating in the first growth phase due to the holding members).

In the process according to the present invention the SiC material deposited in the pores in step 4) and/or on the surface in steps 5) and/or 8) comprises at least 90 wt. % pure silicon carbide (SiC). Preferably the SiC material deposited in the steps 4), 5) and/or 8) comprises at least 91 wt. % at least 92 wt. %, at least 93 wt. %, at least 94 wt. %, at least 95 wt. %, or at least 96 wt. % silicon carbide (SiC). More preferably, the SiC material deposited in the steps 4), 5) and/or 8) comprises at least 97 wt. % SiC, in each case relative to the total weight of the deposited SiC material.

The SiC material deposited in the steps 4), 5) and/or 8) of the process of the present invention further comprises not more than about 10 wt. %, not more than about 9 wt. %, not more than about 8 wt. %, not more than about 7 wt. %, not more than about 6 wt. %, not more than about 5 wt. %, or not more than about 4 wt. % free Si. More preferably, the SiC material deposited in the steps 4), 5) and/or 8) comprises not more than about 3 wt. % free Si, in each case relative to the total weight of the deposited SiC material.

In the process according to the present invention the SiC material deposited in the steps 4), 5) and/or 8) preferably comprises a high purity.

Surprisingly, under the present process conditions only few amounts of amorphous SiC are formed.

The aforementioned amounts of (pure) SiC and free Si relate to the SiC material deposited in the pores of the graphite substrate, forming the tendrils and the interfacial layer, and/or depositing on the surface of the graphite substrate in the first and second growth phase, together forming the outer SiC layer. Accordingly, when referring to SiC in the meaning of e.g. "SiC layer", "SiC coating", "SiC coated body (article)", "SiC (pore) filling", "SiC grain(s)" or "SiC crystal(s)" etc. as used herein in any context with the CVD deposited SiC material in the step 4), 5) and/or 8), not necessarily pure SiC is meant but an SiC material, which may comprise the above cited components in the defined amounts, e.g. in particular free SiC and further impurities besides pure SiC may be present therein.

In principle, the process of the present invention can be applied to any suitable graphite substrate. Preferably the graphite substrates described herein are used.

The process of the present invention further comprises a step 6) of cooling the SiC coated body (or article).

In a further aspect of the present invention the inventors surprisingly found, that the purity of the DMS used as the CVD precursor may influence the formation, crystallinity (quality) and the length of SiC tendrils as described herein. In particular, the inventors surprisingly found that the content of siloxane impurities in the DMS used as the CVD precursor has a remarkable impact on the desired SiC quality, crystal formation and thus the tendril formation. It has also been found, that the content of certain metal impurities, such as metal elements selected from the group consisting of Na, Mg, Al, Ca, Ti, Cr, Mn, Fe, Co, Ni, Cu, Zn, Mo and W, influences the desired SiC tendril formation. Very particularly, the presence of a certain content of metal element impurities selected from Mn, Cu and/or Zn has been found to have a significant impact on the desired SiC tendril formation. More particularly, the presence of a certain content of siloxane impurities together with a certain content of one or more of the metal element impurities selected from Mn, Cu and/or Zn was found to influence the desired SiC tendril formation significantly.

Without being bound to theory it is assumed that the presence of certain amounts of such siloxane impurities, as defined below, has a positive effect with respect to the porosity of the graphite and on the reduction of undesired (toxic) metal impurities. Siloxane impurities introduce a certain amount of oxygen into the reaction system. As already described above in context with the activation of the graphite substrate, the oxygen content in the system has been found to exhibit an influence on the surface porosity under the applied heating conditions. It is assumed that in the CVD process the oxygen deriving from certain amounts of siloxane impurities exhibit an additional surface pore modification effect, which helps to lead the silane deeply into the pores of the activated graphite under the selected process conditions.

It is further assumed that the oxygen deriving from the siloxane impurities captures and thus inactivates undesired metal impurities in the DMS, which then drop down to the bottom of the tank and therewith "purify" the DMS from undesired metal contents.

It has been observed that certain amounts of siloxane impurities lead to the formation of a precipitate or gel in the DMS tank, in the evaporator and/or in the vapour-conducting conduit system. Such gel formation may occur when certain amounts of such siloxane impurities and of one or more of the metal element impurities mentioned above are present, such as in particular when certain amounts of such siloxane impurities and of Mn, Cu and/or Zn are present. Also residual moisture or residual water contents may have a further impact on such gel formation. The amounts of such siloxane impurities in the DMS precursor material used for the CVD method as defined below have been found as advantageous in view of the desired SiC crystallinity, SiC quality and SiC tendril formation as described herein.

Therefore, a further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises (A) dimethyldichlorosilane (DMS) as the main component and (B) at least one further component being different from DMS and being a siloxane compound or a mixture of siloxane compounds, wherein the content of the further component (B) is >0 to 2.00 wt. %, relating to the dimethyldichlorosilane precursor material.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises a content of siloxane compounds (B) of >0 to 1.500 wt. %, preferably >0 to <1.040 wt. %, preferably >0 to 1.000 wt. %, preferably >0 to 0.900 wt. %, preferably >0 to 0.850 wt. %, preferably >0 to 0.800 wt. %, preferably >0 to 0.750 wt. %, preferably >0 to 0.700 wt. %, preferably >0 to 0.600 wt. %, preferably >0 to 0.500 wt. %.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises a content of siloxane compounds (B) of >0 to not more than 0.500 wt. %, preferably >0 to not more than 0.450 wt. %, preferably >0 to not more than 0.400 wt. %, preferably >0 to not more than 0.375 wt. %.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises >0 to 1.000 wt. % 1,3-dichloro-1,1,3,3,-tetramethyldisiloxane, preferably >0 to 0.850 wt. %, preferably >0 to 0.800 wt. %, preferably >0 to 0.750 wt. %, preferably ≤0.725 wt. %, preferably ≤0.710 wt. %, preferably >0 to <700 wt. %.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises >0 to 0.200 wt. % 1,3-dichloro-1,1,3,5,5,5,-hexamethyltrisiloxane, preferably >0 to 0.150 wt. %, preferably >0 to 0.140 wt. %, preferably >0 to 0.130 wt. %, preferably >0 to 0.120 wt. %, preferably >0 to <0.110 wt. %, preferably >0 to <0.100 wt. %.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises >0 to 0.200 wt. % octamethylcyclotetrasiloxane, preferably >0 to 0.190 wt. %, preferably >0 to 0.180 wt. %, preferably >0 to 0.170 wt. %, preferably >0 to 0.160 wt. %, preferably 0 to <0.150 wt. %.

Also metal element impurities may have an influence on the formation and length of the SiC tendrils, e.g. as explained above.

Therefore, a further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component and
  (C) metal elements selected from the group consisting of Na, Mg, Al, Ca, Ti, Cr, Mn, Fe, Co, Ni, Cu, Zn, Mo and W,
wherein the content of the metal elements (C) is ≤30.00 ppm wt., preferably ≤25.00 ppm wt., preferably ≤20.00 ppm wt., relating to the dimethyldichlorosilane precursor material.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component and
  (C) a metal element selected from Mn,
wherein the content of the Mn metal element (C) is <150 ppb wt., preferably <100 ppb wt., preferably <50 ppb wt., preferably <40 ppb wt., preferably <30 ppb wt., preferably <20 ppb wt., preferably the content of Mn is between >0 and 40 ppb wt., relating to the dimethyldichlorosilane precursor material.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component and
  (C) a metal element selected from Cu,
wherein the content of the Cu metal element (C) is <50 ppb wt., preferably <45 ppb wt., preferably ≤40 ppb wt., preferably ≤35 ppb wt., preferably ≤30 ppb wt., preferably ≤25 ppb wt., preferably the content of Cu is between >0 and 25 ppb wt., relating to the dimethyldichlorosilane precursor material.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component and
  (C) a metal element selected from Zn,
wherein the content of the Zn metal element (C) is <50 ppb wt., preferably <45 ppb wt., preferably ≤40 ppb wt., preferably ≤35 ppb wt., preferably ≤30 ppb wt., preferably ≤25 ppb wt., preferably the content of Zn is between >0 and 25 ppb wt., relating to the dimethyldichlorosilane precursor material.

A further aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component and
  (C) the metal elements Mn, Cu and Zn,
wherein the content of the Mn, Cu and Zn metal elements (C) is as defined in the aspects mentioned above.

A further particular aspect of the invention relates to a process for manufacturing a silicon carbide (SiC) coated body in a chemical vapor deposition (CVD) method, using a dimethyldichlorosilane precursor material, wherein the dimethyldichlorosilane precursor material comprises
  (A) dimethyldichlorosilane (DMS) as the main component;
  (B) at least one further component being different from DMS and being a siloxane compound or a mixture of siloxane compounds as defined in anyone of the aspects described above; and
  (C) one or more of the metal elements as defined above, preferably Mn, Cu and Zn,
wherein the content of the siloxane component(s) (B) are as defined in anyone of the aspects described above and the content of the metal elements (C), such as preferably of Mn, Cu and Zn, is as defined in anyone of the aspects described above.

In a further aspect, the DMS with the defined purities is particularly used in a chemical vapor deposition method, which is carried out using $H_2$ as purge gas. Preferably, therein, the dimethyldichlorosilane precursor material is passed into the reaction chamber in a mixture with $H_2$. Further, therein the mixture of the dimethyldichlorosilane precursor material and $H_2$ may be obtained by introducing the $H_2$ gas into the tank containing the dimethyldichlorosilane precursor material, bubbling the $H_2$ through the tank and passing the mixture of the dimethyldichlorosilane precursor material and $H_2$ into the reaction chamber by pushing the mixture from the top of the tank.

In a further aspect, the dimethyldichlorosilane precursor material is further characterized by a content of one or more of the following elements of
calcium<60.00 ppb wt.,
magnesium<10.00 ppb wt.,
aluminium<12.00 ppb wt.,
titanium<1.00 ppb wt.,
chromium<60.00 ppb wt.,
iron<25000 ppb wt.,
cobalt<1.00 ppb wt.,
nickel<30.00 ppb wt.,
zinc<40.00 ppb wt.,
molybdenum<10.00 ppb wt.

A further aspect of the present invention relates to the process as described herein, wherein the dimethyldichlorosilane precursor material is used for depositing silicon carbide on a porous graphite substrate having an open porosity with a porosity degree of ≥6% and ≤15%, preferably 6% to 13%, more preferably 11 to 13%, more preferably on a porous graphite substrate having an open porosity with a porosity degree of 6% to 15%, preferably of ≥6% and <15%, preferably of 6% to 13%, more preferably of 6 to <12%, more preferably of 9 to 11.5%.

Therewith a silicon carbide coated body can be obtained, which is characterized by comprising a connected crystalline SiC material of substantially tetrahedral crystalline SiC and comprising in particular connected crystalline SiC material of substantially tetrahedral crystalline SiC in the form of tendrils extending with a length of at least 50 μm as described herein.

The defined DMS purities are similarly suitable and preferred in the CVD process described above.

The inventors of the present invention further found, that with the specific selection of the CVD conditions and of the substrate material as described herein, it is possible to control the CVD method to deposit essentially stoichiometric SiC, being characterized by a Si:C ratio of 1:1 on the substrate and in the form of tendrils.

Accordingly, a further aspect of the present invention relates to a process for manufacturing a silicon carbide (SiC) coated body in a chemical vapor deposition (CVD) method, using graphite with an open porosity as a substrate and using dimethyldichlorosilane as the silicon source and $H_2$ as purge gas to form substantially stoichiometric silicon carbide, wherein the CVD process is carried out at a temperature in the range of 1000 to 1200° C. under atmospheric pressure, preferably at a temperature in the range of 1000 to <1200° C., preferably 1100 to 1150° C.

The CVD process is preferably carried out for a time period of at least 30 minutes, preferably for a time period of >30 minutes and <12 hours, preferably of >45 minutes and <10 hours, more preferably for at least one hour, more preferably for <10 hours, preferably for <8 hours, preferably for <6 hours, preferably for <4 hours, preferably for <3 hours, most preferred within 1 to 2 hours.

Preferably, the CVD process is carried out with a total flow rate of the mixture of DMS and $H_2$ of 25 to 200 slpm, preferably 40 to 180 slpm, more preferably 60 to 160 slpm.

The inventors of the present invention surprisingly found that under the present process conditions substantially stoichiometric silicon carbide is deposited. Said substantially stoichiometric silicon carbide is further preferably deposited in the form of (crystalline) SiC grains having an average particle size of <10 μm, in particular of 7 μm, more particularly of ≤5 μm or even ≤4 μm or ≤3 μm or even ≤2 μm. Said SiC grains may grow to form SiC crystals having an average particle size of up to 30 μm (≥2 to ≤30 μm), preferably of not more than 20 μm (≥2 to ≤20 μm), preferably of not more than 10 μm (≥2 to ≤10 μm).

Preferably, the substantially stoichiometric SiC crystals in the pores exhibit an average particle size of <10 μm, preferably of ≤7 μm, preferably of ≤5 μm, preferably of ≤4 μm, preferably of ≤3 μm, preferably of ≤2 μm.

Preferably, the substantially stoichiometric SiC crystals formed as the surface coating layer exhibit a larger particle size, preferably an average particle size of ≥10 μm, preferably of ≥10 to 30 μm. This is probably due to the limitation of the crystal growth inside the pores by the space given by the small pore size.

It is however preferred to deposit the SiC with smaller grains and crystal sizes, as smaller grains and crystals form SiC coatings of higher density, whereas larger grains and crystals form SiC coatings of lower density. Therefore the deposition of substantially stoichiometric silicon carbide is desired. The amount of free Si in the deposited SiC is preferably controlled to be in the range as defined herein, thereby achieving the desired grains and crystal size as defined above.

In a further aspect thereof, said process is in particular carried out without adding methane gas and/or without using argon, accordingly it is preferred that the presence of methane and/or argon is excluded. This is important as the presence of methane gas or argon negatively effects the formation of stoichiometric SiC when using DMS.

In a further aspect thereof, said process is in particular carried out without using any additional silane source besides dimethyldichlorosilane. The advantageous SiC characteristics and crystal size and quality can be achieved with DMS as the sole organosilane source.

In a further aspect thereof, said process is in particular carried out by passing the dimethyldichlorosilane into the reaction chamber in a gaseous mixture with $H_2$.

In a further aspect thereof, said process is in particular carried out by using a mixture of the dimethyldichlorosilane and $H_2$, which is obtained by introducing the $H_2$ gas into the tank containing the dimethyldichlorosilane, bubbling the $H_2$ through the tank and passing the mixture of the dimethyldichlorosilane and $H_2$ into the reaction chamber by pushing the mixture from the top of the tank.

In a further aspect thereof, said process is in particular carried using DMS, which comprises a certain content of (total) siloxane impurities as defined above, such as of >0 to 2.000 wt. %, preferably >0 to 1.500 wt. %, preferably >0 to <1.040 wt. %, preferably >0 to 1.000 wt. %, preferably >0 to 0.900 wt. %, preferably >0 to 0.850 wt. %, preferably >0 to 0.800 wt. %, preferably >0 to 0.750 wt. %, preferably >0 to 0.700 wt. %, preferably >0 to 0.600 wt. %, preferably >0 to 0.500 wt. %.

In a further aspect thereof, said process is in particular carried using DMS, which comprises a content of
Mn metal element of <150 ppb wt., preferably <100 ppb wt., preferably <50 ppb wt., preferably <40 ppb wt., preferably <30 ppb wt., preferably <20 ppb wt.; and/or
Cu metal element of <50 ppb wt., preferably <45 ppb wt., preferably ≤40 ppb wt., preferably ≤35 ppb wt., preferably ≤30 ppb wt., preferably ≤25 ppb wt.; and/or
Zn metal element of <50 ppb wt., preferably <45 ppb wt., preferably ≤40 ppb wt., preferably ≤35 ppb wt., preferably ≤30 ppb wt., preferably ≤25 ppb wt.

In a further aspect thereof, said process is in particular carried out by depositing SiC from dimethyldichlorosilane as the precursor material on a porous graphite substrate.

To positively influence (trigger) the nucleation and formation of the desired stoichiometric substantially tetrahedral SiC crystals a porous substrate is advantageous. Without being bound to theory it is assumed that a porous substrate surface provides a suitable basis to facilitate and support nucleation and crystallization of the deposited SiC in the desired quality.

Accordingly, it turned out as advantageous to use a porous surface to deposit the SiC thereon and thus achieve the desired effects described herein.

The porosity characteristics of the substrate can be selected as described herein, to achieve the above described characteristics of the SiC coated substrate. As mentioned above, it is preferred that the porous graphite substrate comprises pores with a surface pore diameter of up to 30 µm, preferably 10 to 30 µm.

In a further aspect thereof, said process is in particular carried out using a porous graphite substrate with an open porosity with a porosity degree of ≥6% and ≤15%, preferably 6 to 13%, more preferably 11 to 13%. It turned out as particularly advantageous to use a graphite substrate having an open porosity with a small porosity degree of 6% to 15%, preferably of ≤6% and <15%, preferably of 6% to 13%, more preferably of 6 to <12%, more preferably of 9 to 11.5%.

Preferably, the porous graphite as described anywhere herein is used.

It is particularly preferred to use the CVD process described herein, wherein the dimethyldichlorosilane precursor material is used for depositing substantially stoichiometric silicon carbide with substantially tetrahedral SiC crystals on the surface of the porous graphite substrate and in the pores of the porous graphite substrate to form tightly connected crystalline SiC material in the form of tendrils extending from the porous graphite surface into the graphite substrate and being tightly connected with the SiC surface coating.

In a further aspect thereof, in said process the amount of free Si in the SiC deposited on the graphite substrate comprises not more than about 7 wt. %, preferably not more than about wt. 5%, more preferably not more than about 3 wt. % free Si.

The inventors of the present invention further surprisingly found that under the specific CVD conditions as described herein, the particle size of the SiC grains correlate to the amount of DMS introduced into the reaction chamber. The introduction of lower amounts of DMS surprisingly leads to the formation of smaller grains and crystals, whereas the introduction of larger amounts of DMS surprisingly leads to the formation of larger grains and crystals. Smaller grains and crystals further form SiC coatings of higher density, whereas larger grains and crystals form SiC coatings of lower density. Therewith, the CVD deposition can be controlled to provide multilayer SiC coatings having varying densities.

Accordingly, a further aspect of the present invention relates to a process for manufacturing a silicon carbide (SiC) coated body comprising at least two SiC layer of different density, the process comprising the steps
- A) positioning a porous graphite substrate having an open porosity in a process chamber;
- B) heating the porous graphite substrate in the process chamber to a temperature in the range of 1000 to 1200° C. under atmospheric pressure in the presence of $H_2$ as purge gas;
- C) depositing in a first deposition phase crystalline SiC grains on the surface of the graphite substrate by introducing a mixture of dimethyldichlorosilane (DMS) and $H_2$ into the process chamber with a first amount of DMS;
- D) increasing or reducing the amount of DMS and depositing in a second deposition phase crystalline SiC grains on the SiC coated graphite substrate of step C) by introducing a mixture of DMS and $H_2$ into the process chamber with a second amount of DMS;
- E) optionally repeating step D) one or more times, thereby carrying out one or more additional steps of depositing in one or more additional deposition phases crystalline SiC grains on the SiC coated graphite substrate by introducing a mixture of DMS and $H_2$ into the process chamber with one or more further amounts of DMS;
- F) cooling the body resulting from step E).

In a further aspect said process further comprises prior to step C) the following step
- B-2) introducing a mixture of dimethyldichlorosilane (DMS) and $H_2$ for at least 30 minutes into the process chamber and depositing in an infusion phase crystalline SiC grains in the open pores of the graphite substrate by chemical vapor deposition (CVD) and allow growing of the crystalline SiC grains to SiC crystals until a connected crystalline SiC material in the form of tendrils extending with a length of at least 50 µm into the porous graphite substrate is formed.

In a further aspect said process comprises the following steps G) and H) following step F):
- G) changing the position of the body resulting from step F); and
- H) repeating step C) and optionally steps D) and E), thereby depositing crystalline SiC grains on the surface of the porous graphite substrate resulting from step F) by chemical vapor deposition (CVD) and allow growing of the crystalline SiC grains to substantially tetrahedral SiC crystals until one or more further SiC layers are formed; followed by
  cooling the body resulting from step H).

In a further aspect of said process in the optional step E) the amount of DMS is gradually increased.

In a further aspect of said process in step D) the second amount of DMS is twice as much as the first amount in step C).

In a further aspect of said process in step E) a third deposition phase is carried out with a third amount of DMS, which is three times as much as the first amount in step C).

In a further aspect of said process in step E) a third and fourth deposition phase are carried out with a third and fourth amount of DMS, wherein the fourth amount of DMS is four times as much as the first amount in step C).

In a further aspect of said process the DMS amounts in the deposition phases are controlled to effect the formation of smaller SiC crystals having smaller particle size by introducing a decreased amount of DMS and to effect the formation of larger SiC crystals having a larger particle size by introducing an increased amount of DMS.

In a further aspect of said process the thickness of the SiC coatings deposited in the deposition phases is varied by carrying out the individual deposition phases for varying time periods.

In a further aspect of said process the porous graphite substrate of step A) has a porosity degree of ≥6% and ≤15%, preferably 6% to 13%, more preferably 11 to 13%. More preferably, the porous graphite substrate of step A) has a porosity degree of ≥6% and <15%, preferably 6% to 13%, more preferably 6 to <12%, more preferably 9 to 11.5% and/or comprises pores with a surface pore diameter of 10 to 30 µm.

More preferably a porous graphite substrate as described anywhere herein is used.

In a further aspect of said process the mixture of DMS and $H_2$ is obtained by introducing the $H_2$ gas into the DMS tank, bubbling the $H_2$ through the DMS in the tank and passing the mixture of DMS and $H_2$ into the process chamber by pushing the mixture from the top of the tank.

In a further aspect of said process the dimethyldichlorosilane used for the CVD deposition is characterized by having a content of siloxane impurities as defined above, preferably of >0 to 2.00 wt. %, preferably of >0 to 1.500 wt. %, preferably of >0 to <1.040 wt. %.

In a further aspect of said process the dimethyldichlorosilane used for the CVD deposition is characterized by having a content of metal element impurities as defined above, preferably of Mn, Cu and Zn impurities as defined above.

More preferably, the dimethyldichlorosilane used for the CVD deposition is characterized by having a content of siloxane and metal impurities as defined above in detail.

In a further aspect of said process step B-2) is carried out until a connected crystalline SiC material in the form of tendrils extending with a length of at least 75 µm, preferably at least 100 µm, preferably 75 to 200 µm is formed.

In a further aspect of said process the infusion phase of step B-2) is carried out until an interfacial layer is formed, comprising the porous graphite with SiC filled pores and having a thickness of at least 50 µm, preferably at least 75 µm, preferably at least 100 µm, preferably at least 150 µm, preferably at least 200 µm, more preferably about 200 to about 500 µm, wherein the interfacial layer is located between the graphite substrate and the SiC surface layer formed in steps C) to E) and step H).

Preferably, the process is controlled to deposit in one or more of steps C), D), E) and H) substantially tetrahedral crystalline SiC having an average particle size of ≥10 µm, preferably of ≥10 to 30 µm and/or which is controlled to deposit in step B-2) substantially tetrahedral crystalline SiC in the pores of the graphite substrate having an average particle size of <10 µm, preferably of ≤7 µm, preferably of ≤5 µm, preferably of ≤4 µm, preferably of ≤3 µm, preferably of ≤2 µm.

Preferably, the SiC deposition is carried out at a temperature in the range of 1000 to <1200° C., preferably 1100 to 1150° C.

Preferably, the infusion phase of step B-2) is carried out for a time period of >30 minutes and <12 hours, preferably of >45 minutes and <10 hours, more preferably for at least one hour, more preferably for <10 hours, preferably for <8 hours, preferably for <6 hours, preferably for <4 hours, preferably for <3 hours, most preferred within 1 to 2 hours.

The SiC material deposited herein is characterized by a similar crystallinity, grain/crystal size and purity etc. as described above. However, the density of the SiC deposited in the different steps varies.

Accordingly, with the process of the present invention it is possible to provide an SiC coated article, wherein one or more selected surface areas of the graphite substrate are coated with the outer SiC coating layer. It is also possible to deposit the SiC coating in step E) and/or H) not over a complete surface of the porous graphite substrate but only to selected and discrete areas of a surface of the substrate. This can be achieved e.g. by using a kind of mask as commonly used in established coating techniques.

III. Products

A further aspect of the present invention relates to the products being obtainable by the processes of the present invention, comprising the intermediate components such as the graphite substrate as well as the SiC coated articles.

1. Purified Graphite Member

A further aspect of the present invention relates to the purified graphite member with a modified surface porosity, obtainable by a process as described above.

Preferably, such purified graphite member with a modified surface porosity has a chlorine content as defined above, preferably present in the porous graphite member as defined above.

Preferably, the purified graphite member with a modified surface porosity of the present invention comprises pores with an enlarged average pore size (pore diameter) and comprises pores with an enlarged surface pore diameter of ≥10 µm.

The grain size of the graphite is usually not effected by the process and accordingly the purified graphite member with a modified surface porosity according to the present invention has an average grain size of <0.05 mm, preferably of ≤0.04 mm, preferably ≤0.03 mm, preferably ≤0.028 mm, preferably ≤0.025 mm, preferably ≤0.02 mm, preferably ≤0.018 mm, preferably ≤0.015 mm.

Preferably, such purified graphite member with a modified surface porosity has an open porosity with a porosity degree of ≥6% and ≤15%, preferably of about 6% to about 13%, preferably of about 11% to about 13%. More preferably the purified graphite member has an open porosity with a porosity degree of 6% to 15%, preferably of ≥6% and <15%, preferably of 6% to 13%, more preferably of 6 to <12%, more preferably of 9 to 11.5%.

Preferably, such purified graphite member with a modified surface porosity has a density as defined above.

Preferably, such purified graphite member with a modified surface porosity has a purity as defined above.

The purified graphite member with a modified surface porosity as described herein may preferably be used as a substrate in a silicon carbide coated graphite article.

Therein, the modified surface porosity can be characterized as described above in detail.

In particular, the purified graphite member with a modified surface porosity as defined herein is suitable as a substrate in a chemical vapor deposition (CVD) method for depositing silicon carbide thereon, such as in particular in a CVD method as described herein, using dimethyldichlorosilane (DMS) as the silane source or CVD precursor, preferably with $H_2$ as purge gas.

More particularly, the purified graphite member with a modified surface porosity as defined herein is suitable as a substrate in a chemical vapor deposition (CVD) method for depositing silicon carbide in the pores of the purified graphite substrate, such as in particular in a CVD method as described herein, using dimethyldichlorosilane (DMS) as the silane source or CVD precursor, preferably with $H_2$ as purge gas.

The purified graphite member with a modified surface porosity as defined herein is for the reasons explained above particularly suitable as a substrate in a chemical vapor deposition (CVD) method for depositing silicon carbide in the pores of the activated substrate forming a connected substantially tetrahedral crystalline SiC material in the form of tendrils extending with a length of at least 50 μm.

By depositing SiC on a purified graphite member as described herein, it is possible, to provide graphite member with a silicon carbide layer on one or more surfaces and/or on one or more selected and discrete surface areas.

Accordingly, such purified graphite member with a modified surface porosity as described above are particularly suitable for manufacturing articles for high temperature applications, susceptors and reactors, semiconductor materials, wafer.

2. Activated Graphite Substrate

A further aspect of the present invention relates to the activated graphite substrate with a modified surface porosity, obtainable by a process as described above.

Preferably, such activated graphite substrate with a modified surface porosity has a chlorine content as defined above, preferably present in the porous graphite substrate as defined above.

Preferably, such activated graphite substrate with a modified surface porosity exhibits the above described surface pore modifications with the enlarged surface pore diameters.

In particular, such activated graphite substrate with a modified surface porosity comprises pores with an enlarged average pore size (pore diameter) and comprising pores with a surface pore diameter of ≥10 μm, preferably of ≥10 μm up to 30 μm.

Similar as explained above, such activated graphite substrate with a modified surface porosity has an average grain size of <0.05 mm, preferably of ≤0.04 mm, preferably ≤0.03 mm, preferably ≤0.028 mm, preferably ≤0.025 mm, preferably ≤0.02 mm, preferably ≤0.018 mm, preferably ≤0.015 mm.

Preferably, such activated graphite substrate with a modified surface porosity has an open porosity with a porosity degree of ≥6% and ≤15%, preferably of about 6% to about 13%, preferably of about 11% to about 13%, even more preferably of 6% to 15%, preferably of ≥6% and <15%, preferably of 6% to 13%, more preferably of 6 to <12%, more preferably of 9 to 11.5%.

Preferably, such activated graphite substrate with a modified surface porosity has a density as defined above.

Preferably, such activated graphite substrate with a modified surface porosity has a purity as defined above.

The activated graphite substrate with a modified surface porosity as described herein may preferably be used as a substrate in a silicon carbide coated graphite article.

In particular, the activated graphite substrate with a modified surface porosity as defined herein is suitable as a substrate in a chemical vapor deposition (CVD) method for depositing silicon carbide thereon, such as in particular in a CVD method as described herein, using dimethyldichlorosilane (DMS) as the silane source or CVD precursor, preferably with $H_2$ as purge gas.

In particular, the activated graphite substrate with a modified surface porosity as defined herein is suitable as a substrate in a chemical vapor deposition (CVD) method for depositing silicon carbide in the pores of the activated graphite substrate, preferably forming a connected substantially tetrahedral crystalline SiC material in the form of tendrils extending with a length of at least 50 μm, such as in particular in a CVD method as described herein, using dimethyldichlorosilane (DMS) as the silane source or CVD precursor, preferably with $H_2$ as purge gas.

By depositing SiC on a activated graphite substrate as described herein, it is possible, to provide a graphite substrate with a silicon carbide layer on one or more surfaces and/or on one or more selected and discrete surface areas.

Accordingly, such activated graphite substrate with a modified surface porosity as described above are particularly suitable for manufacturing articles for high temperature applications, susceptors and reactors, semiconductor materials, wafer.

IV. Silicon Carbide Coated Bodies

A further aspect of the present invention covers the silicon carbide coated bodies (or articles) obtained from the process as described above.

Preferably, a further aspect of the present invention relates to silicon carbide coated bodies (or articles), comprising I) a porous graphite substrate having a porosity degree of 6% to 15%;

II) at least one SiC coating layer;

and

III) an interfacial layer, located between the graphite substrate I) and the SiC coating layer II), comprising the porous graphite and having pores with an average surface pore diameter of 10 μm, wherein the pores filled with a connected crystalline SiC material in the form of tendrils of at least 50 μm length, which extend from the at least one SiC coating layer II) into the porous graphite substrate.

A further aspect of the present invention relates to the silicon carbide coated bodies (or articles) described above, wherein the pores in the interfacial layer III) are filled with a connected crystalline SiC material in the form of tendrils extending with a length of at least 75 μm, preferably at least 100 μm, preferably 75 to 200 μm. Regarding the definition of the pore filling, reference is made to the explanations above.

A further aspect of the present invention relates to silicon carbide coated bodies (or articles) as described herein, wherein the interfacial layer III) located between the graphite substrate I) and the SiC coating layer(s) II) exhibits a thickness of at least 100 μm, preferably of >100 μm, more preferably of at least 200 μm, even more preferably of about 200 to about 500 μm.

A further aspect of the present invention relates to the silicon carbide coated bodies (or articles) described above, wherein the porous graphite substrate I) exhibits a porosity of >6% to <15% or a porosity in a range of about 6% to about 14%, about 6% to about 13%, about 6% to <13%, or a porosity in a range of >6% to about 15%, about 7% to about 15%, about 8% to 15%, about 9% to about 15%, about 10% to about 15%, about 11% to about 15%, or a porosity in a range of ≥11% to about 13%. Even more preferred is a porosity degree of ≥6% and <15%, more preferably 6% to 13%, more preferably 6 to <12%, more preferably 9 to 11.5%.

Said porosity degree relates to the structure of the graphite and said pores are filled with SiC as described herein. However, the mere graphite porosity is not affected or changed by the CVD method and the present porosity degree can thus be considered as a "SiC-filled porosity".

A further aspect of the present invention relates to silicon carbide coated bodies (or articles) described above, wherein the at least one SiC coating layer II) comprises >90 wt. silicon carbide (SiC). Preferably the SiC coating layer(s) comprise at least 91 wt. %, at least 92 wt. %, at least 93 wt. %, at least 94 wt. %, at least 95 wt. %, or at least 96 wt. % silicon carbide. More preferably, the SiC coating layer(s) comprises at least 97 wt. % silicon carbide (SiC), in each case relative to the total weight of the SiC coating layer(s). As explained above, said silicon carbide is preferably substantially tetrahedral crystalline SiC.

A further aspect of the present invention relates to silicon carbide coated bodies (or articles) as described herein, wherein the at least one SiC coating layer II) further comprises not more than about 10 wt. %, not more than about 9 wt. %, not more than about 8 wt. %, not more than about 7 wt. %, not more than about 6 wt. %, not more than about 5 wt. %, or not more than about 4 wt. % free Si. More preferably, the SiC coating layer(s) comprise not more than about 3 wt. % free Si, in each case relative to the total weight of the SiC coating layer(s).

A further aspect of the present invention relates to silicon carbide coated bodies (or articles) as described herein, wherein the SiC coating layer II) covering the graphite substrate I) is a homogeneous and continuous, essentially impervious SiC layer.

A further aspect of the present invention relates to silicon carbide coated bodies (or articles) as described herein, wherein the SiC coating layer(s) II) covering the graphite substrate is essentially free of cracks, holes, spellings or other noticeable surface defects and/or exhibits essentially a continuous thickness over the whole coated surface area.

A further aspect of the present invention relates to silicon carbide coated bodies (or articles) as described herein, wherein the interfacial layer III) located between the graphite substrate I) and the SiC coating layer II) is formed by the porous graphite, wherein the pores comprise a filling of SiC, and wherein at least 70% of the walls of the open pores of the graphite are filled with the SiC. Regarding the definition of the pore filling, reference is made to the explanations above. As explained therein, the pore filling degree in accordance with the present invention relates to the degree of coating of the inner walls of the open pores, of which preferably at least 70% are coated with a deposited SiC coating.

More preferably, the interfacial layer III) comprises a pore filling degree of at least about 75%, 80%, 85%, 90% of the walls of the open pores. The degree of pore filling can be determined as mentioned above.

A further aspect of the present invention relates to silicon carbide coated bodies (or articles) as described herein, wherein the average particle size of the SiC crystals in the filled pores of the interfacial layer III) is <10 µm, such as preferably >2 to <10 µm and/or the average particle size of the SiC crystals of the outer coating layer ii) is not more than 30 µm, preferably ≥10 to 30 µm.

A further aspect of the present invention relates to silicon carbide coated bodies (or articles) as described herein, wherein the interfacial layer III) located between the graphite substrate I) and the SiC coating layer II) is formed by the porous graphite, wherein the pores comprise a filling of a connected substantially tetrahedral crystalline SiC material in the form of extended tendrils, wherein said SiC material comprises >90 wt-% silicon carbide (SiC). Preferably said SiC material in the pores of the interfacial layer III) comprises at least 91 wt. %, at least 92 wt. %, at least 93 wt. %, at least 94 wt. %, at least 95 wt. %, or at least 96 wt. % silicon carbide. More preferably, the SiC material in the pores of the interfacial layer III) comprises at least 97 wt. % SiC, in each case relative to the total weight of the SiC material in the pore filling.

A further aspect of the present invention relates to silicon carbide coated bodies (or articles) as described herein, wherein the interfacial layer Ill) located between the graphite substrate I) and the SiC coating layer II) is formed by the porous carbon, wherein the pores comprise a filling of a connected substantially tetrahedral crystalline SiC material in the form of extended tendrils, wherein said SiC material further comprises not more than about 10 wt. %, not more than about 9 wt. %, not more than about 8 wt. %, not more than about 7 wt. %, not more than about 6 wt. %, not more than about 5 wt. %, or not more than about 4 wt. % free Si. More preferably, the SiC material in the pores of the interfacial layer Ill) comprises not more than about 3 wt. % free Si, in each case relative to the total weight of the SiC material in the pore filling.

A further aspect of the present invention relates to silicon carbide coated bodies (or articles) as described herein, wherein the SiC in the pores and/or on the surface of the graphite substrate is substantially stoichiometric SiC with a Si:C ratio of 1:1.

A further aspect of the present invention relates to silicon carbide coated bodies (or articles) as described herein, wherein the SiC in the pores and/or on the surface of the graphite substrate has a density close to the theoretical density of SiC of 3.21 g/cm$^3$. Preferably, the deposited SiC has a density of at least 2.50 g/cm$^3$, preferably in the range of 2.50 to 3.21 g/cm$^3$, more preferably in the range of 3.00 to 3.21 g/cm$^3$.

A further aspect of the present invention relates to silicon carbide coated bodies (or articles) as described herein, wherein the density of the tendrils in the interfacial layer (amount of tendrils per area) is ≥6% and 15%, preferably 6% to 13%, more preferably 6 to ≤12%, more preferably 9 to 11.5%.

A further aspect of the present invention relates to silicon carbide coated bodies (or articles) as described herein, comprising a homogeneous, dense and/or uniform distribution of the tendrils in the interfacial layer.

A further aspect of the present invention relates to silicon carbide coated bodies (or articles) as described herein, wherein the tendrils are (tightly) connected with the SiC of the surface coating layer.

A further aspect of the present invention relates to silicon carbide coated bodies (or articles) as described herein, comprising the SiC layer II) and optionally also the interfacial layer Ill) on one or more selected and discrete surface areas of the graphite substrate.

The interfacial layer of the silicon carbide coated body of the present invention creates a coefficient of thermal expansion (CTE) averaging between the graphite substrate and the SiC coating layer for the entire body. For example, the CTE mismatch between the substrate and the SiC layer can be reduced by about 20% in a silicon carbide coated body wherein about 20% of the porous substrate are filled with SIC. Accordingly, a further aspect of the present invention relates to a silicon carbide coated body as described herein having an improved coefficient of thermal expansion between the graphite substrate and the SiC coating layer. The CTE according to the present invention can be determined by known methods.

A further aspect of the present invention relates to silicon carbide coated bodies (or articles) as described herein, having an improved residual compressive load in the SiC layer, preferably higher than 190 MPa, preferably higher than 50 MPa. The residual compressive load according to the present invention can be determined by known methods.

A further aspect of the present invention relates to silicon carbide coated bodies (or articles) as described herein, having an improved impact resistance. The impact resistance according to the present invention can be determined by known methods.

A further aspect of the present invention relates to silicon carbide coated bodies (or articles) as described herein, having an improved fracture toughness. The fracture toughness according to the present invention can be determined by known methods.

A further aspect of the present invention relates to silicon carbide coated bodies (or articles) as described herein, having an improved exfoliation, peeling and/or warpage resistance. The exfoliation resistance (strength) can be determined by known methods, e.g. as described in US 2018/0002236 A1.

A further aspect of the present invention relates to silicon carbide coated bodies (or articles) as described herein, having an improved adhesion between the graphite substrate I) and the SiC coating layer II). The adhesion between the graphite substrate I) and the SiC coating layer II) according to the present invention can be determined by known methods.

A further aspect of the present invention relates to silicon carbide coated bodies (or articles) as described herein, exhibiting an improved relation between the size of the outer (upper) surface of the SiC coating layer to the size of the interfacial layer. The relation between the size of the outer (upper) surface of the SiC coating layer to the size of the interfacial layer according to the present invention can be determined by known methods.

A further aspect of the present invention relates to silicon carbide coated bodies (or articles), comprising I-A) a porous graphite substrate having a porosity degree of 6% to 15% and comprising pores with a surface pore diameter of 10 to 30 µm and II-A) at least two SiC coating layer of different density covering the porous graphite substrate; and optionally III-A) an interfacial layer located between the graphite substrate and the SiC coating layers comprising the porous graphite and pores filled with a tightly connected substantially tetrahedral crystalline SiC material in the form of tendrils extending with a length of at least 50 µm from the at least one SiC coating layer into the porous graphite substrate.

In a further aspect of such multilayer SiC coated articles the at least two SiC coating layer(s) II-A) are characterized by different crystal sizes.

In a further aspect of such multilayer SiC coated articles the graphite substrate has a porosity of ≥6% and ≤15%, preferably 6% to 13%, more preferably 11 to 13%, more preferably of ≥6% and <15%, preferably 6% to 13%, more preferably 6 to <12%, more preferably 9 to 11.5%.

Preferably, the graphite substrate comprises pores with a surface pore diameter of up to 30 µm.

Preferably, the graphite substrate has an average pore size (pore diameter) of 0.4-5.0 µm, preferably 1.0 to 4.0 µm and comprises pores with a surface pore diameter of up to 30 µm, preferably up to 20 µm, preferably up to 10 µm, preferably pores with a surface pore diameter of 10 to 30 µm are present.

Preferably, the graphite substrate has an average grain size of <0.05 mm, preferably of <0.04 mm, preferably <0.03 mm, preferably <0.028 mm, preferably <0.025 mm, preferably <0.02 mm, preferably <0.018 mm, preferably <0.015 mm.

Preferably, the graphite substrate has a density of ≥1.50 g/cm$^3$, preferably ≥1.70 g/cm$^3$, preferably ≥1.75 g/cm$^3$.

In a further aspect of such multilayer SiC coated articles the interfacial layer III-A) is present, having pores filled with a tightly connected substantially tetrahedral crystalline SiC material in the form of tendrils extending with a length of at least 75 µm, preferably at least 100 µm, preferably 75 to 150 µm into the graphite substrate.

V. Use

A further aspect of the present invention relates to the use of the purified, chlorinated and/or activated graphite members, as well as the various silicon carbide coated bodies (or articles) obtainable by the methods as described herein for manufacturing articles for high temperature applications, susceptors and reactors, semiconductor materials, wafer etc.

The present invention is further illustrated by the Figures and the following examples without being limited thereto.

DESCRIPTION OF THE FIGURES AND THE REFERENCE SIGNS

FIG. 1 shows a SEM image with a 680 fold magnification of a silicon carbide coated body according to the present invention with a graphite substrate (1) and SiC tendrils (4) in the interfacial layer (3) thereof as well as the SiC coating layer (2). It can be seen that the interfacial layer (3) has a thickness of approximately 200 µm, i.e. SiC tendrils (4) extend into the porous graphite substrate (1) with a length of at least 50 µm. The SiC coating layer (2) has a thickness of approximately 50 µm FIG. 2 shows a SEM image with a 1250 fold magnification of a silicon carbide coated body with a multilayer SiC coating of different density. The different SiC coating layers exhibit different thickness with a first SiC layer (2-A) of approximately 43 µm thickness, a second SiC layer (2-B) of approximately 7 µm thickness, and a third SiC layer (2-C) of approximately 50 µm thickness. The image further shows the tendrils (4) with the SiC pore filling in the form of a SiC coating of the inner walls of the open pores (5) in the interfacial layer (3).

Figure 5A:
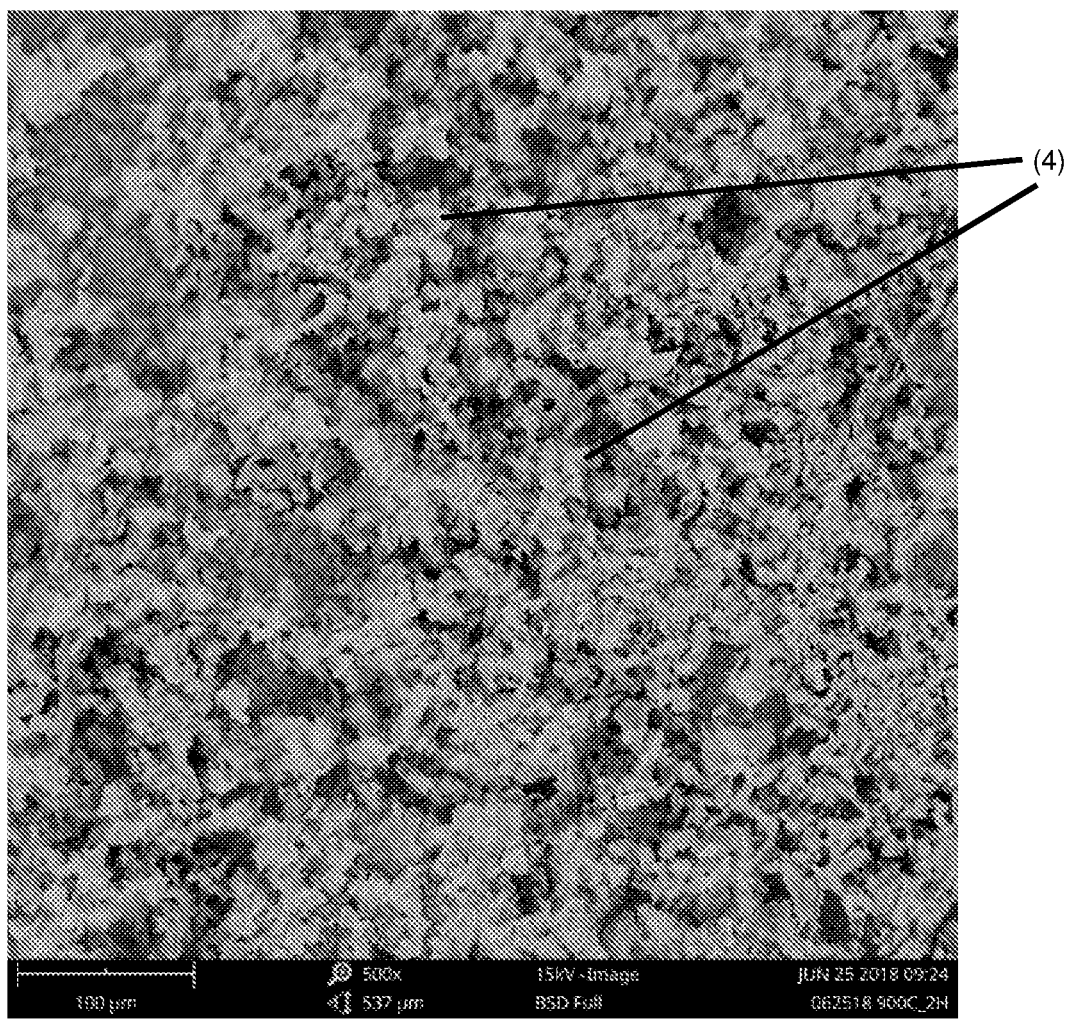
Figure 5B:
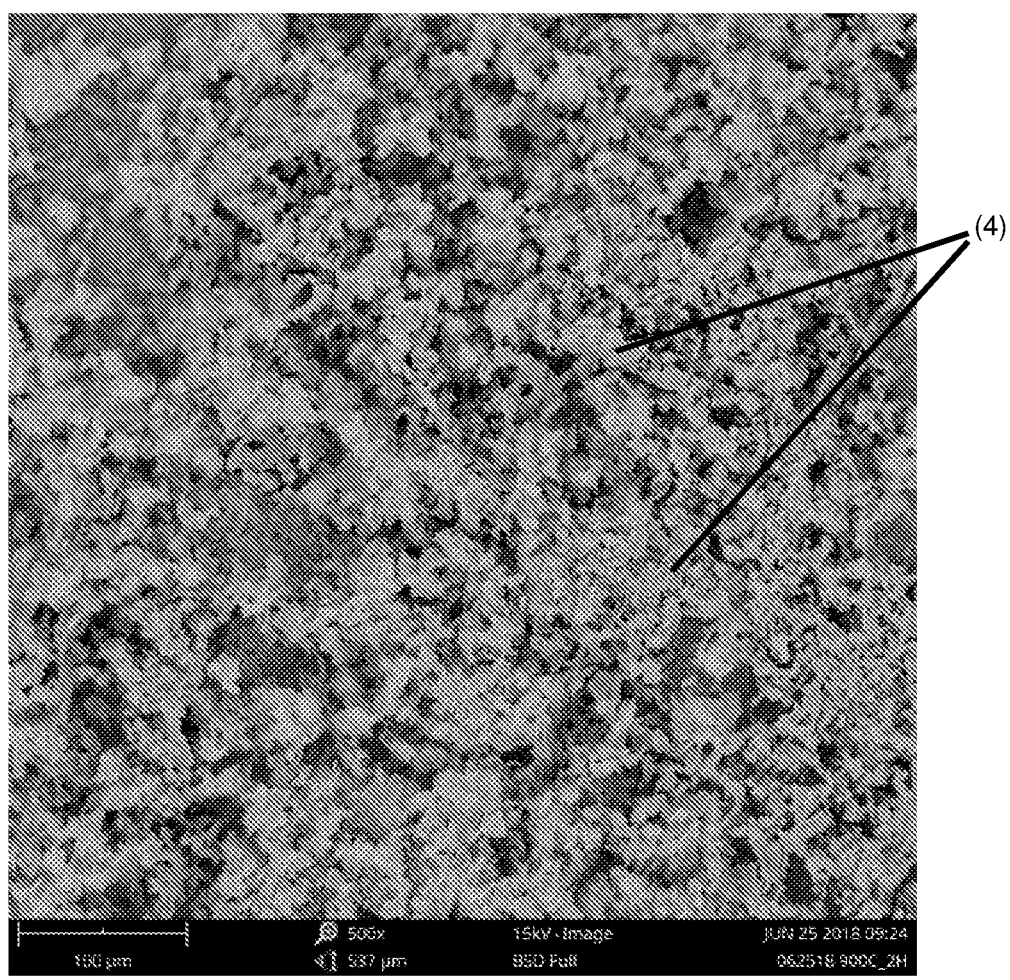
Figure 6A:
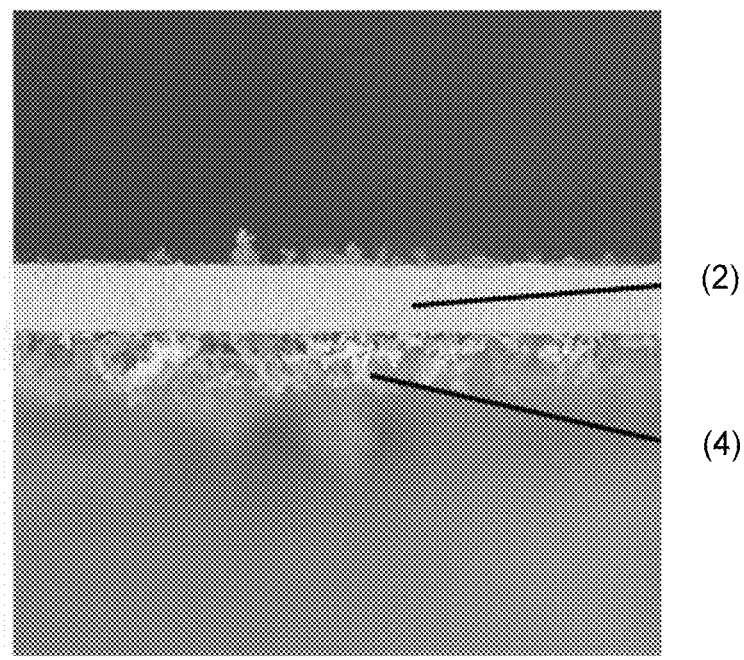
Figure 6B:
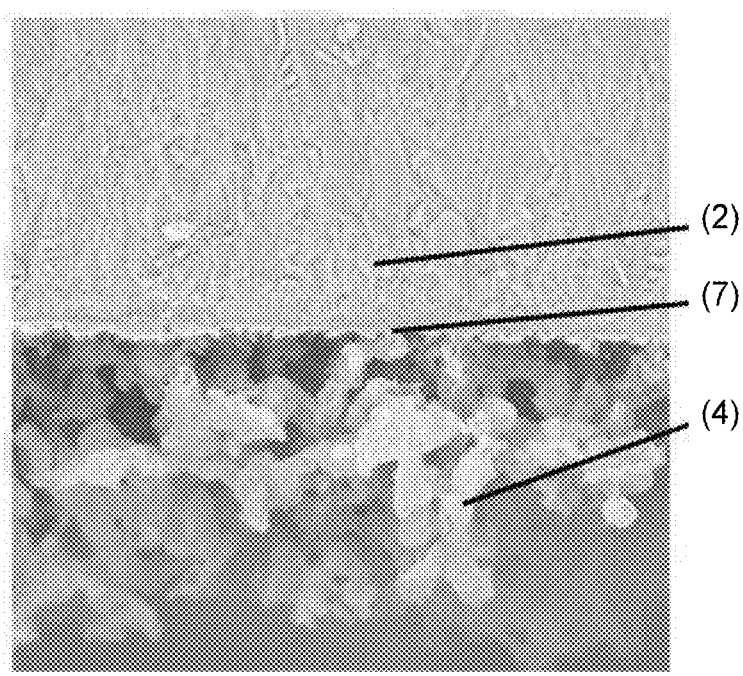
Figure 7A:
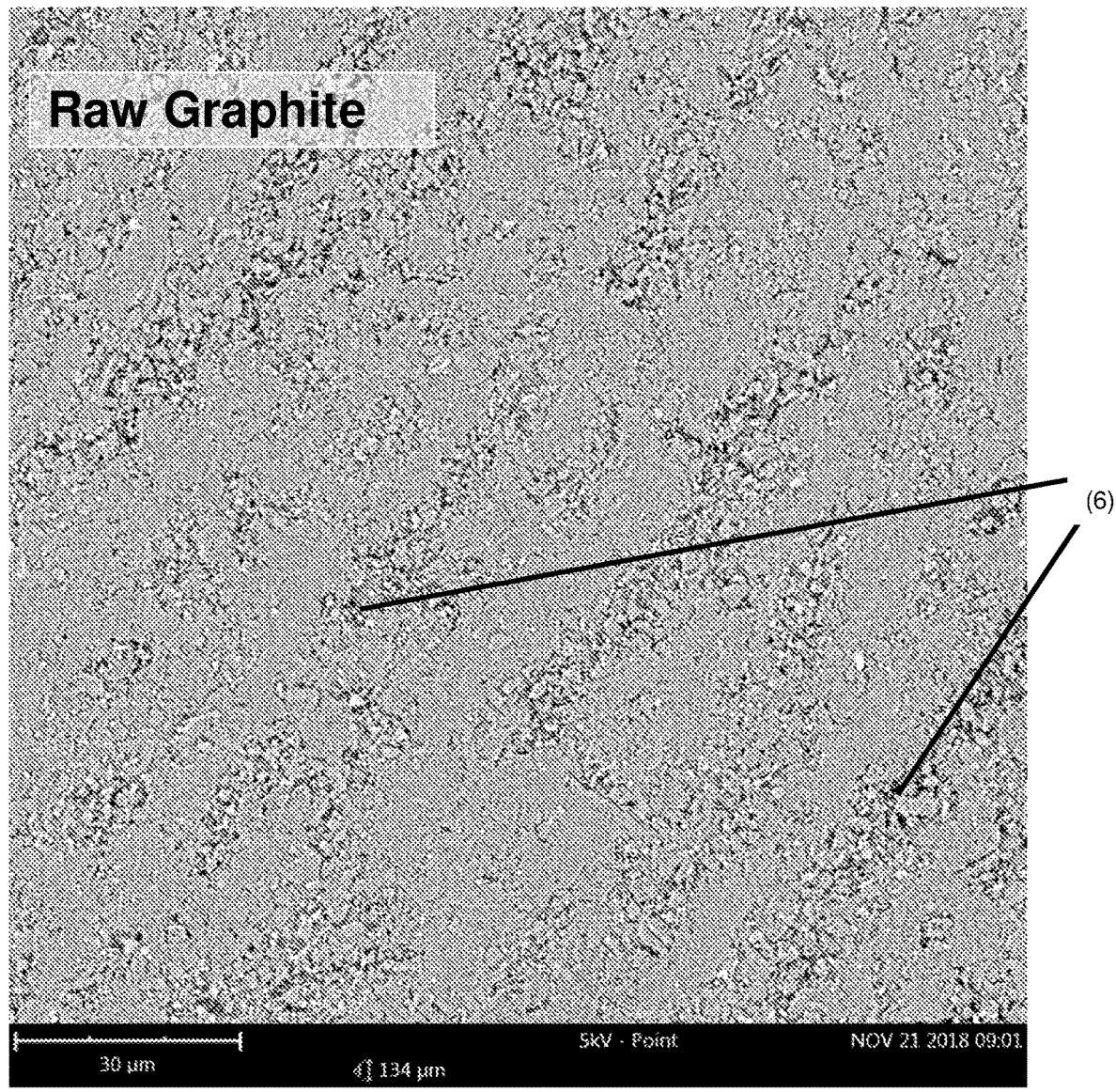
Figure 7B:
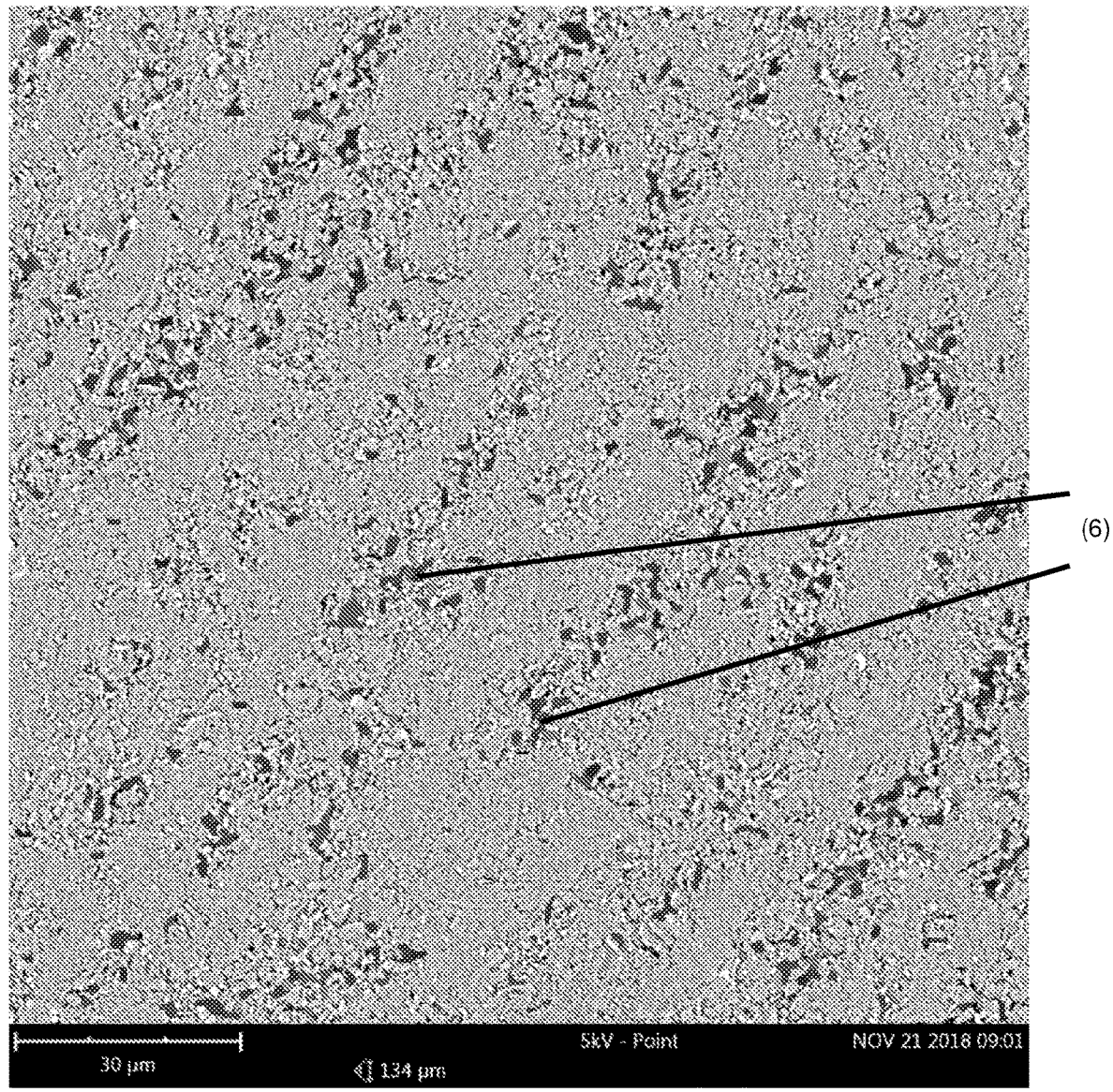
Figure 7C:
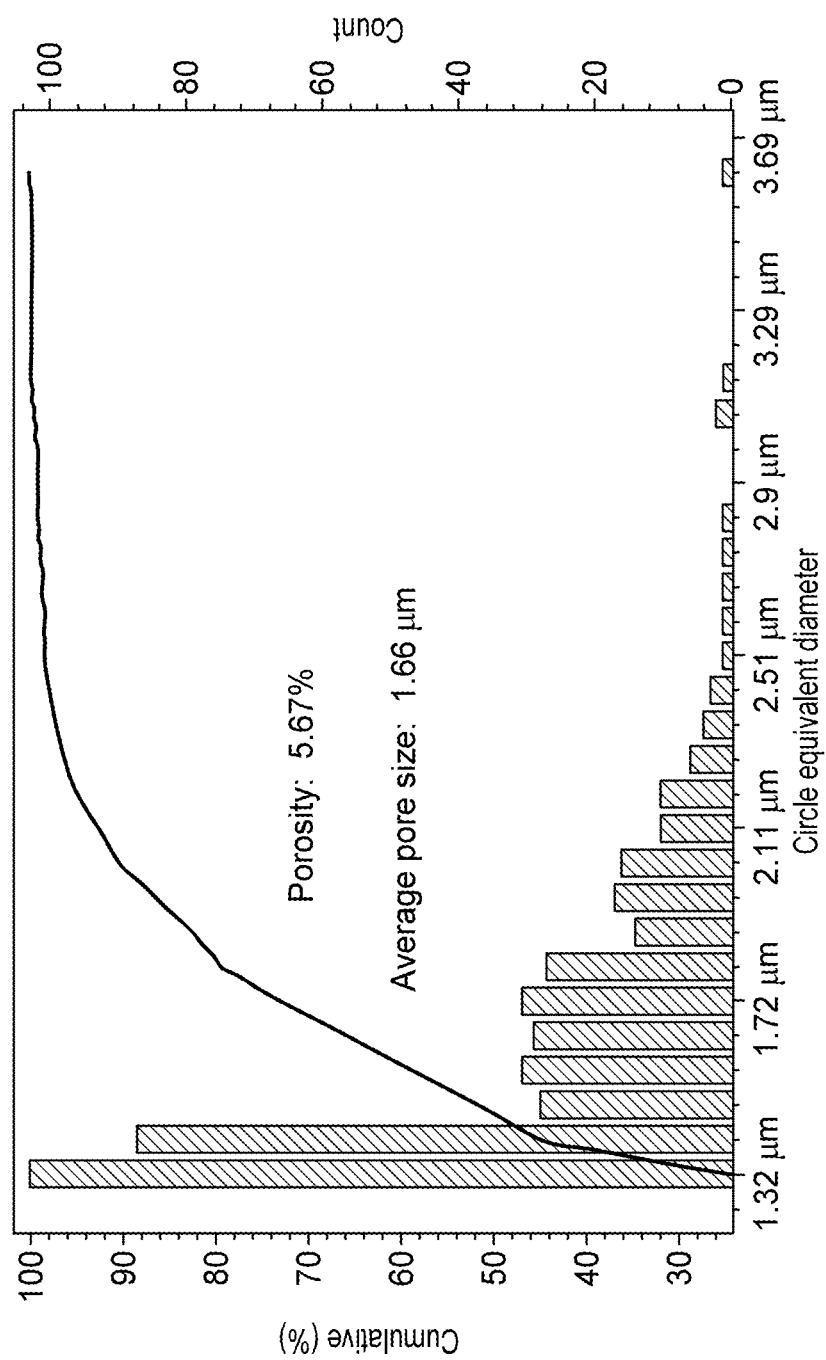

FIGS. 5a and 5b show a SEM image with a 500 fold magnification of a top view on the SiC tendrils (4); therefore, the graphite substrate was burnt off in air, morphology and distribution of the tendrils is visible, the distribution of tendril is very uniform and dense FIG. 6a shows a SEM image with a 390 fold magnification of a cross-sectional view of SiC tendrils (4), which connect with the SiC coating layer (2) very firmly FIG. 6b shows a SEM image with a 2000 fold magnification of the cross-sectional view of SiC tendrils (4), which connect with the SiC coating layer (2) very firmly FIGS. 7a and 7b show a SEM image with a 2000 fold magnification of a porous graphite material prior to the purification and activation process of the present invention (pre-product) having quite small pores wherein the pores have a pore size/diameter<10 µm FIG. 7c shows the pore distribution and the average pore size of said porous graphite material prior to the purification and activation process of the present invention (pre-product)

Figure 8A:
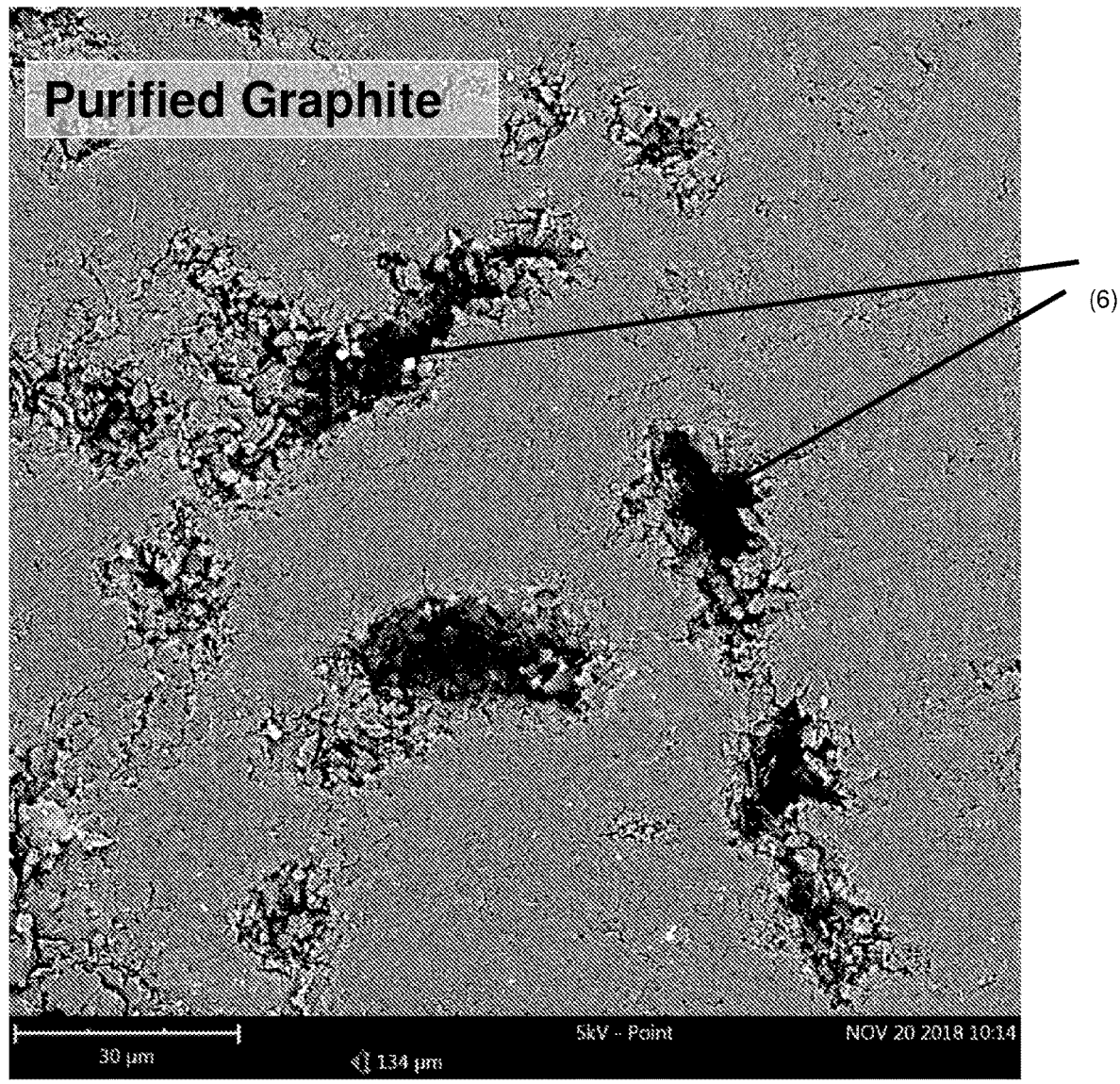
Figure 8B:
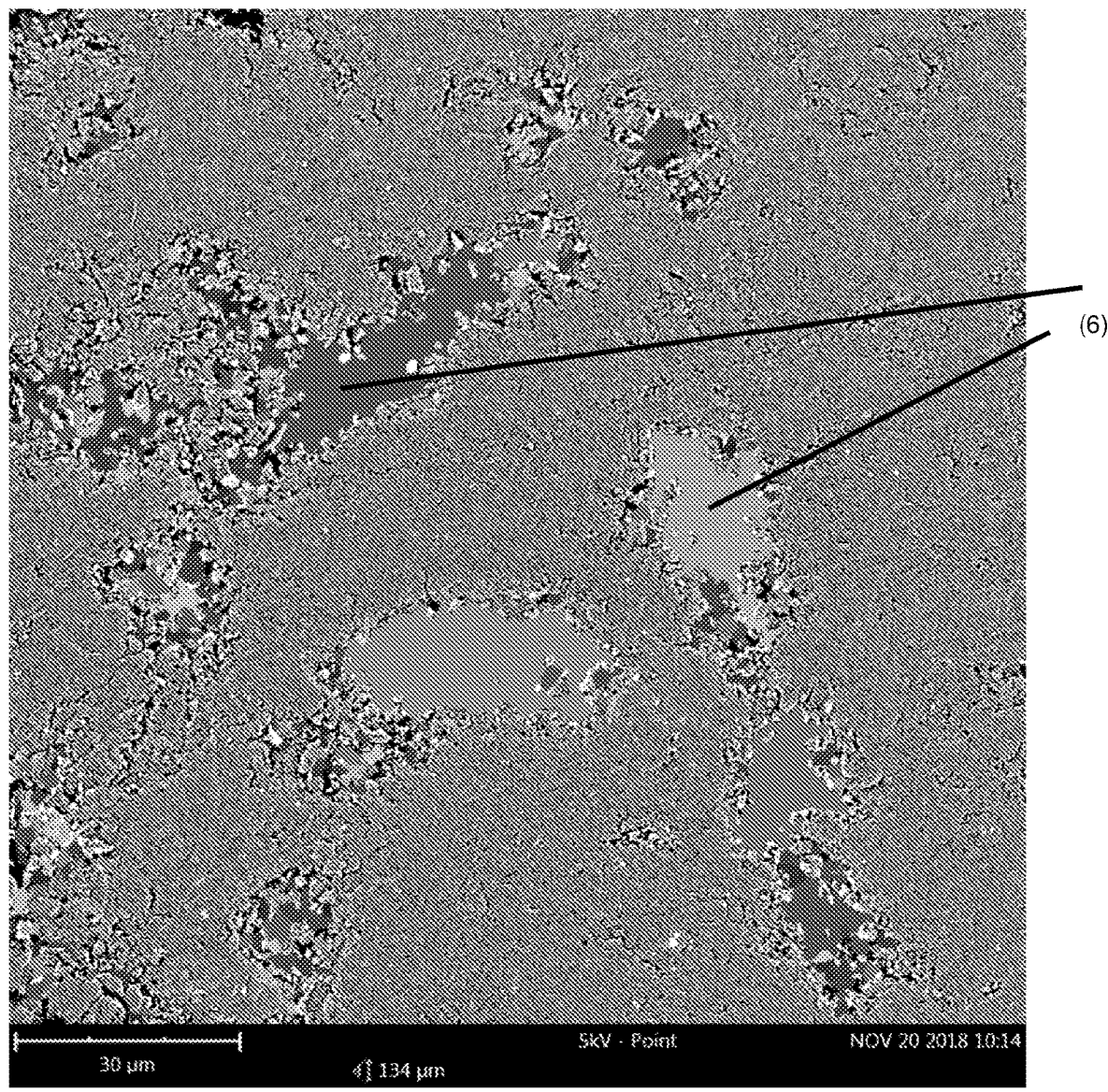
Figure 8C:
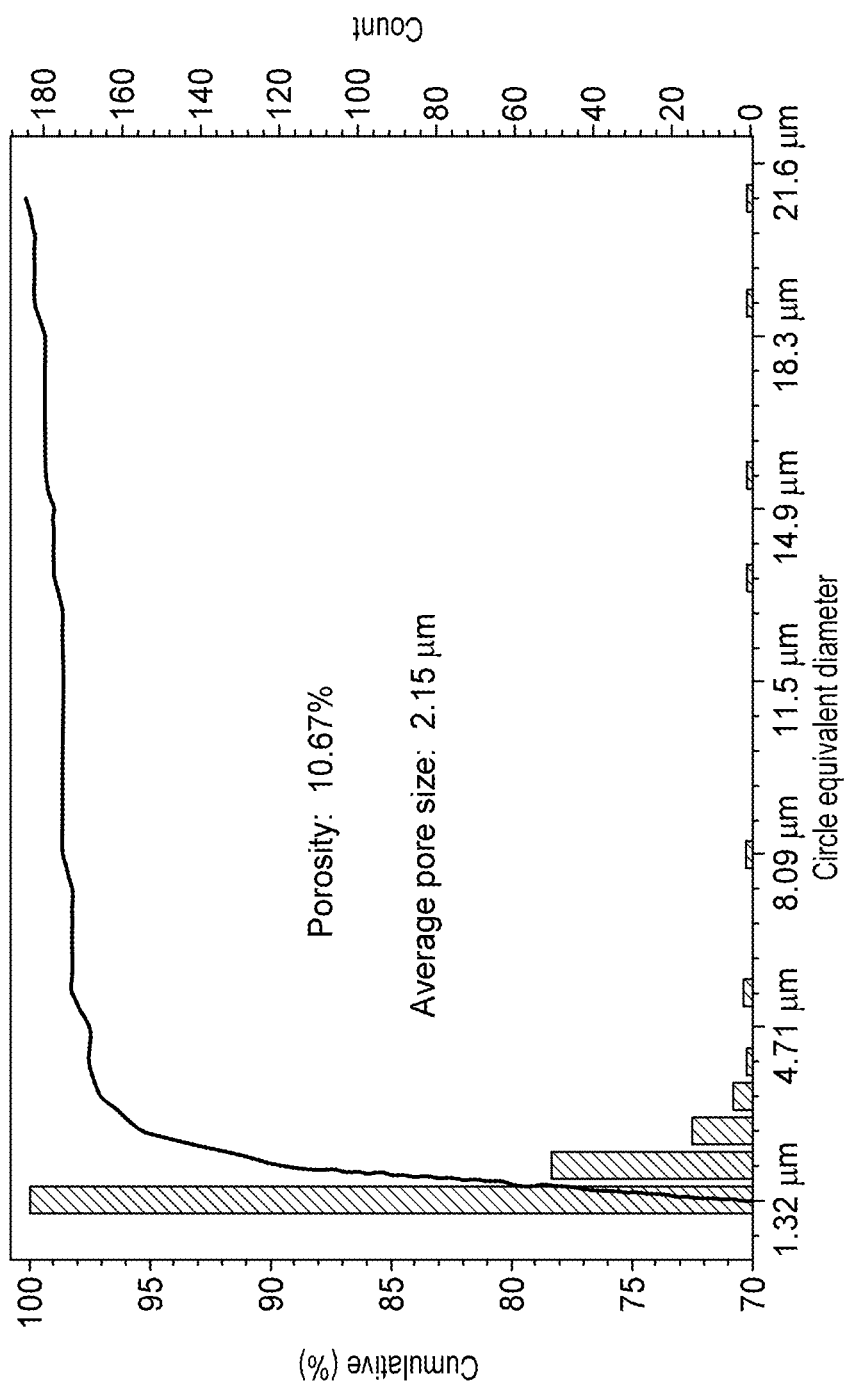
Figure 9:
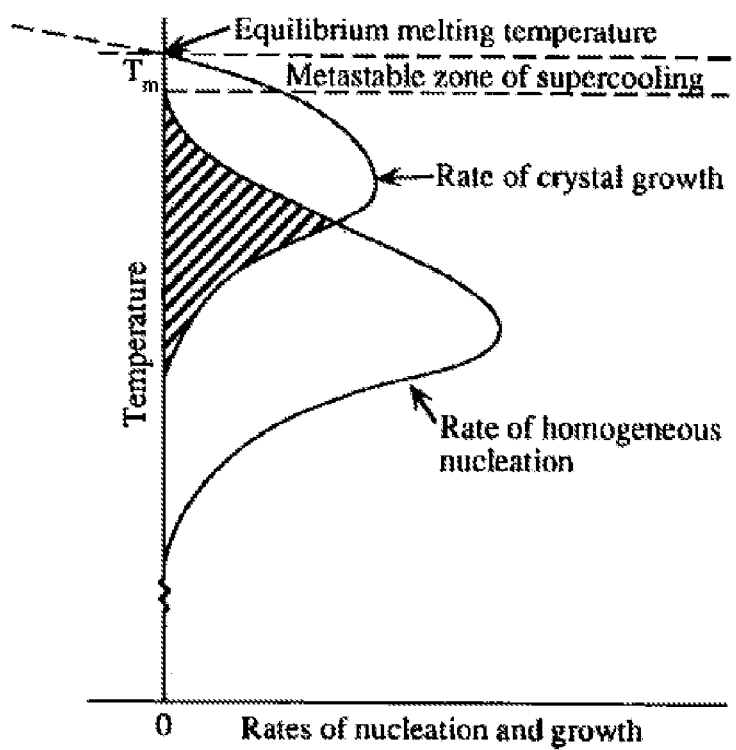
Figure 10:
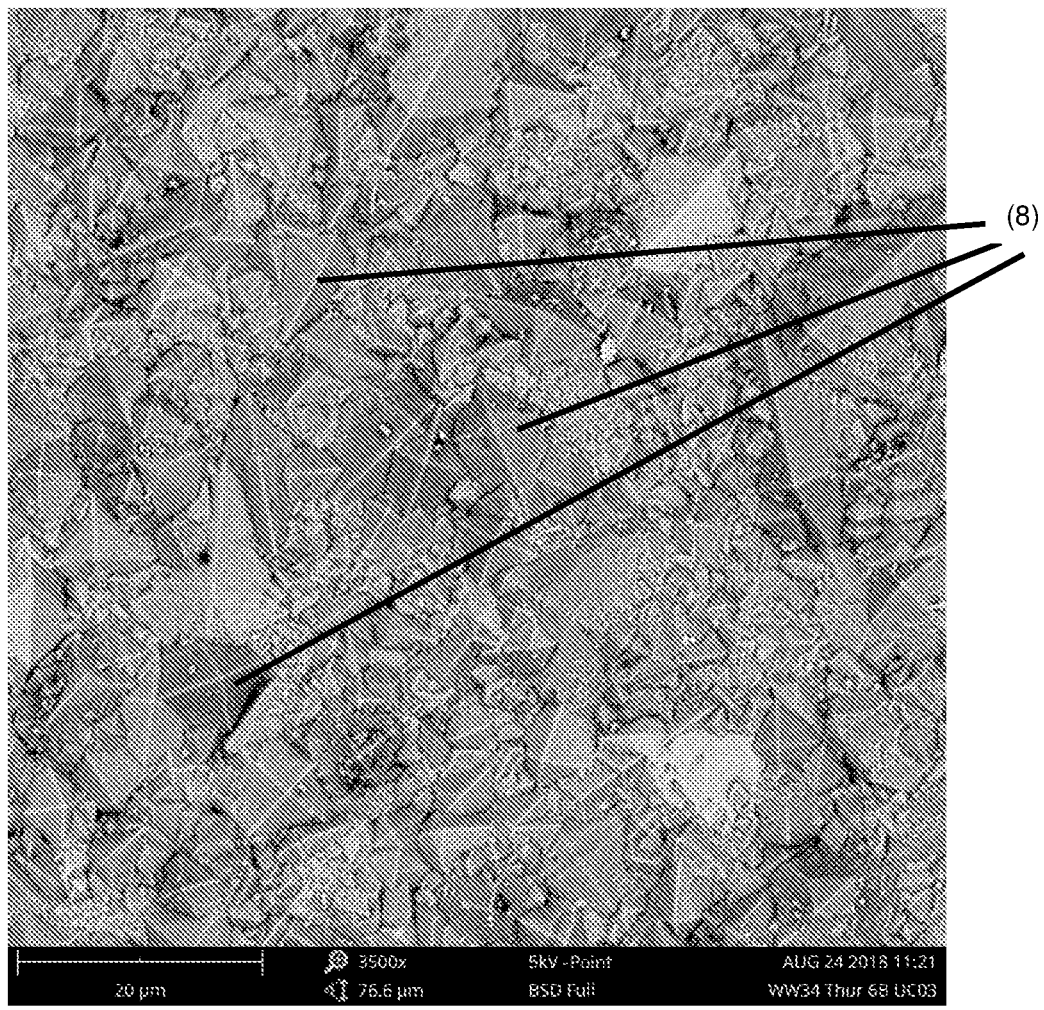
Figure 11:
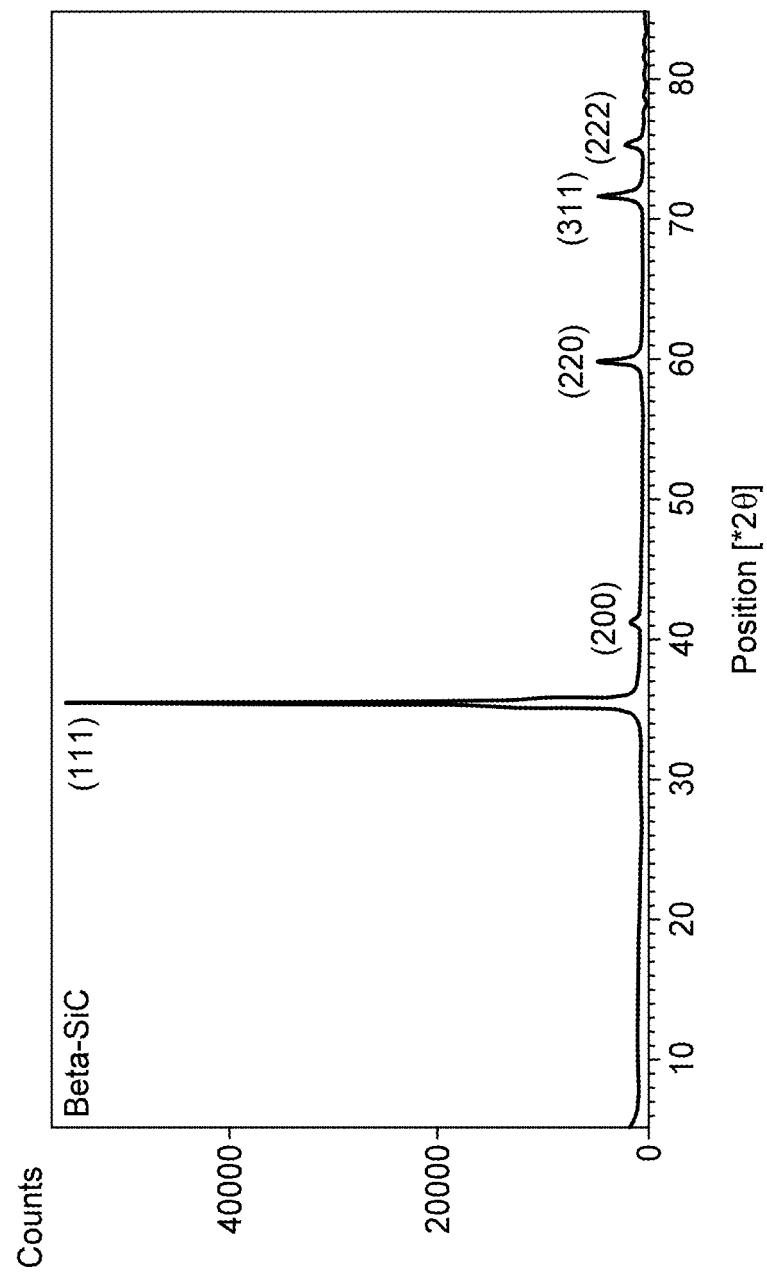

FIGS. 8a and 8b show a SEM image with a 2000 fold magnification of a porous graphite material after the activation process of the present invention clearly showing the modified surface porosity with the significantly enlarged surface pores, now comprising a significant amount of enlarged pores having a pore size/diameter 10 μm FIG. 8c shows the pore distribution and the average pore size of said porous graphite material after the activation process of the present invention illustrating the increased porosity degree and the increased average pore size compared to the graphite material prior to the activation process FIG. 9 illustrates the critical temperature dependency and its influence on SiC nucleation, growth and crystal formation in a CVD process FIG. 10 shows a SEM image with a 3500 fold magnification of a top view on the improved SiC material of the present invention with the substantially tetrahedral crystallinity and the crystal size up to 10 to 30 μm being clearly visible FIG. 11 shows an XRD pattern of the improved SiC material of the present invention showing a very sharp p-sic crystallinity peak and showing very little side-product peaks or amorphous SiC, which confirms the high purity and crystallinity of the SiC formed in the process of the present invention (1) porous graphite substrate
(2) SiC coating layer
(2-A), (2-B), (2-C) SiC coating layers of different density
(3) interfacial layer with
(4) tendrils formed in open pores
(5) SiC coating on the inner walls of open pores
(6) open pores in the graphite substrate
(7) tight connection between tendrils and coating layer
(8) tetrahedral crystals

VI. Examples

Example 1—Activation and Chlorination of a Graphite Member and Tendril Formation A porous graphite member was activated, purified and subjected to a chlorination treatment as described in the present invention.

The following chlorine content was measured in the chlorinated graphite member:

| element | graphite member |
| --- | --- |
| Cl | 0.06 ppm wt. |

The formation of activated graphite with enlarged surface porosity has been shown in FIGS. 7a to c compared to FIGS. 8a to c. The SEM has been prepared as described above.

The chlorinated graphite member was used as a porous graphite substrate (1) in a CVD deposition method as described herein.

In the CVD method SiC tendrils (4) according to the present invention were formed in the pores (6) of the accordingly chlorinated graphite substrate, as shown in FIGS. 1, 2, 3, 4, 5a, 5b, 6a and 6b.

The SiC characteristics and quality described herein has been shown in FIGS. 10 and 11.

Example 2—Influence of the Purge Gas

A silicon carbide coated body was prepared with the process of the present invention using $H_2$ as the purge gas.

As a comparative Example, argon was used as purge gas.

Figure 1:
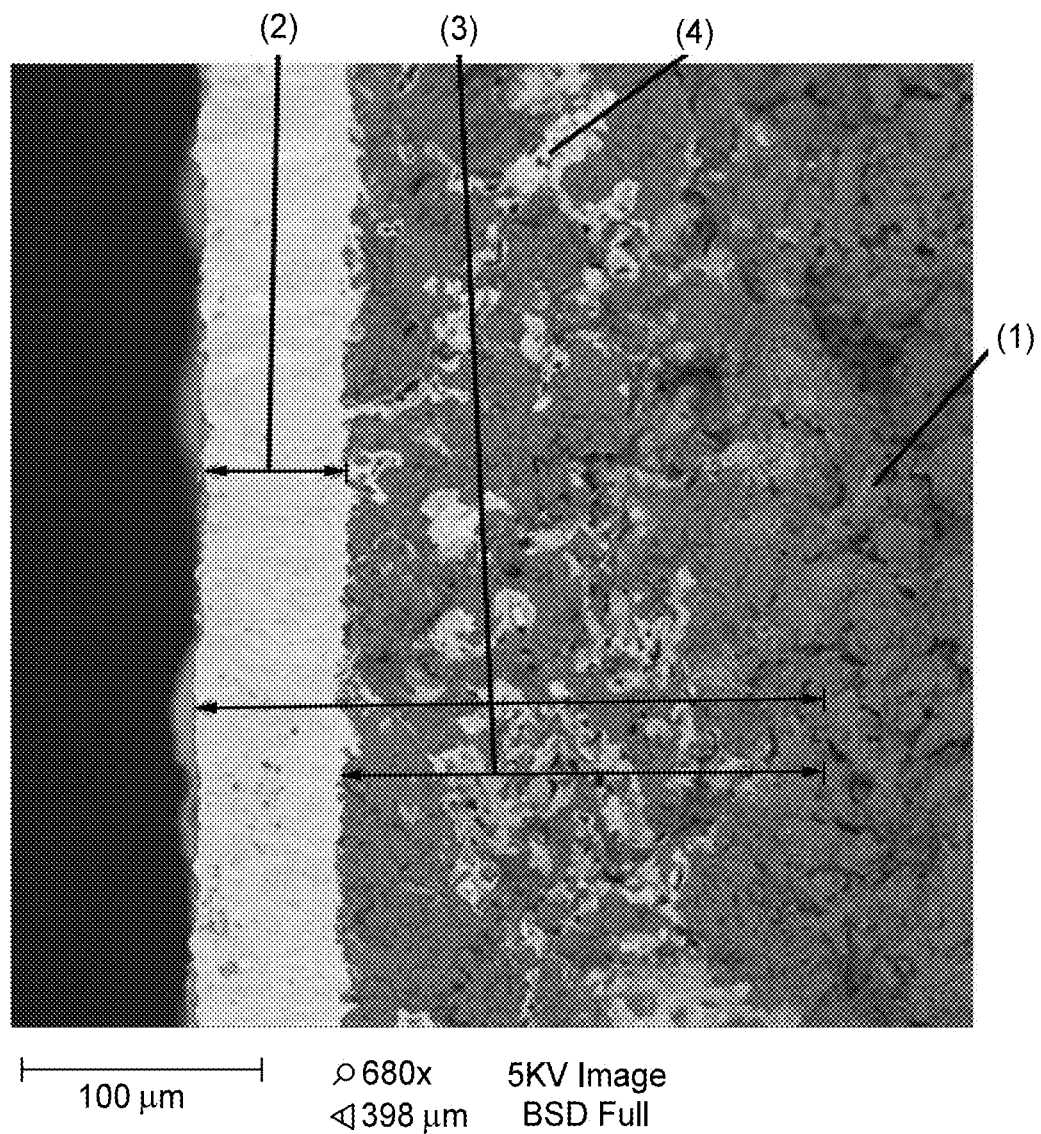
Figure 4:
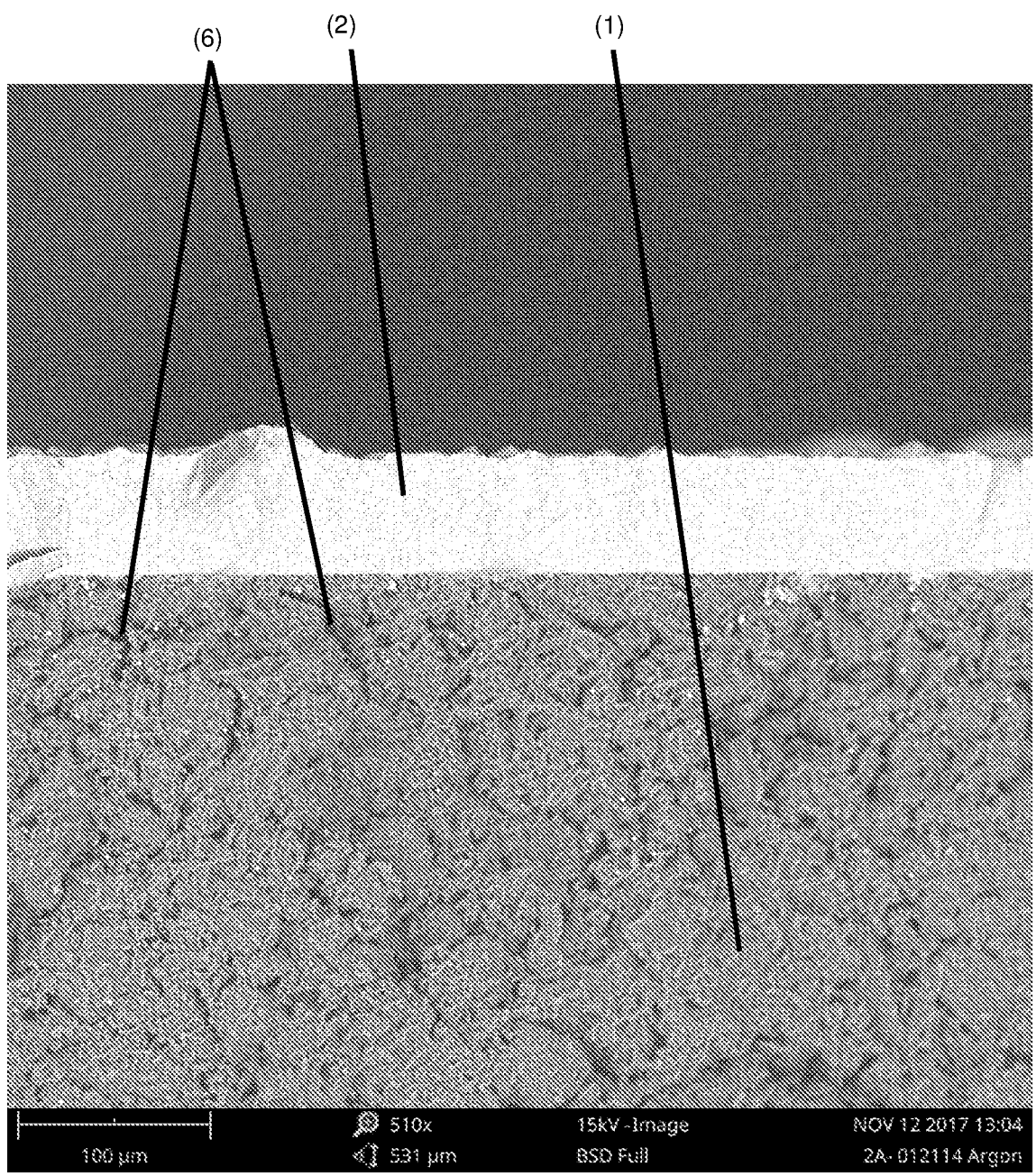
FIG. 4 shows a SEM image with a 510 fold magnification of a silicon carbide coated body with a SiC coating layer (2) of more than 50 µm thickness on the porous graphite substrate (1) but without formation of tendrils and an interfacial layer due to the use of argon as purge gas. The open pores (6) of the graphite substrate (1) are well apparent.

As becomes apparent from FIGS. 1 and 4, the use of argon does not lead to the formation of tendrils (4).

Example 3—Multilayer SiC-Coating

A silicon carbide coated body was prepared with the process of the present invention, therein varying the amounts of DMS for preparing a multilayer SiC coating having varying densities (2-A), (2-B), (2-C) etc.

Therein, the following DMS amounts were introduced into the process chamber of a laboratory size test reactor using $H_2$ as the carrier gas in the deposition phases:

| Deposition phase | DMS amount |
| --- | --- |
| 1. | approximately 0.5 g/minute |
| 2. | approximately 1.0 g/minute |
| 3. | approximately 1.5 g/minute |
| 4. | approximately 2.0 g/minute |

The SiC coatings deposited in the first to fourth deposition phase showed varying crystal sizes, which increased with increasing DMS amounts, leading to SiC coating layers with decreasing density.

Figure 2:
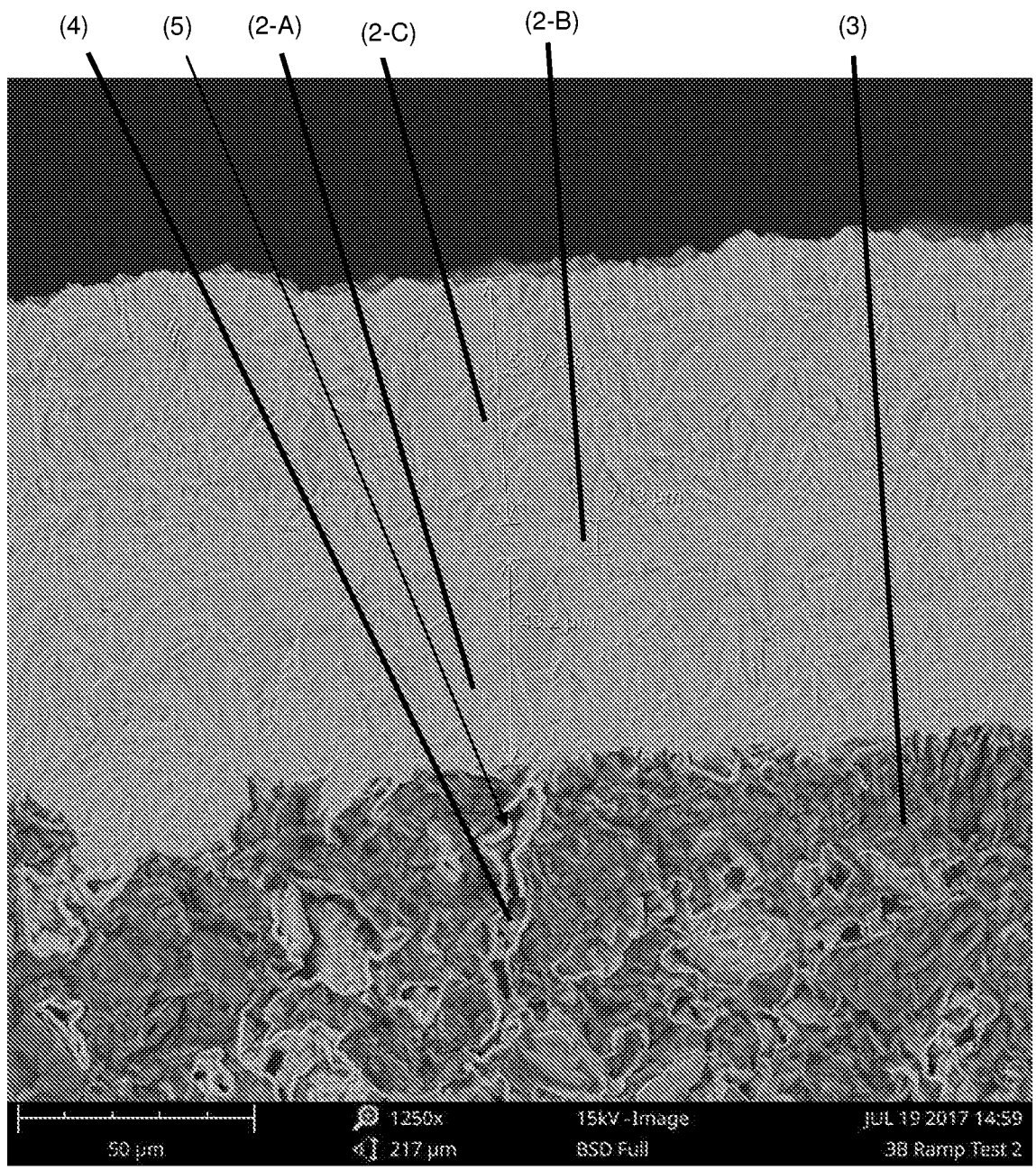
Figure 3:
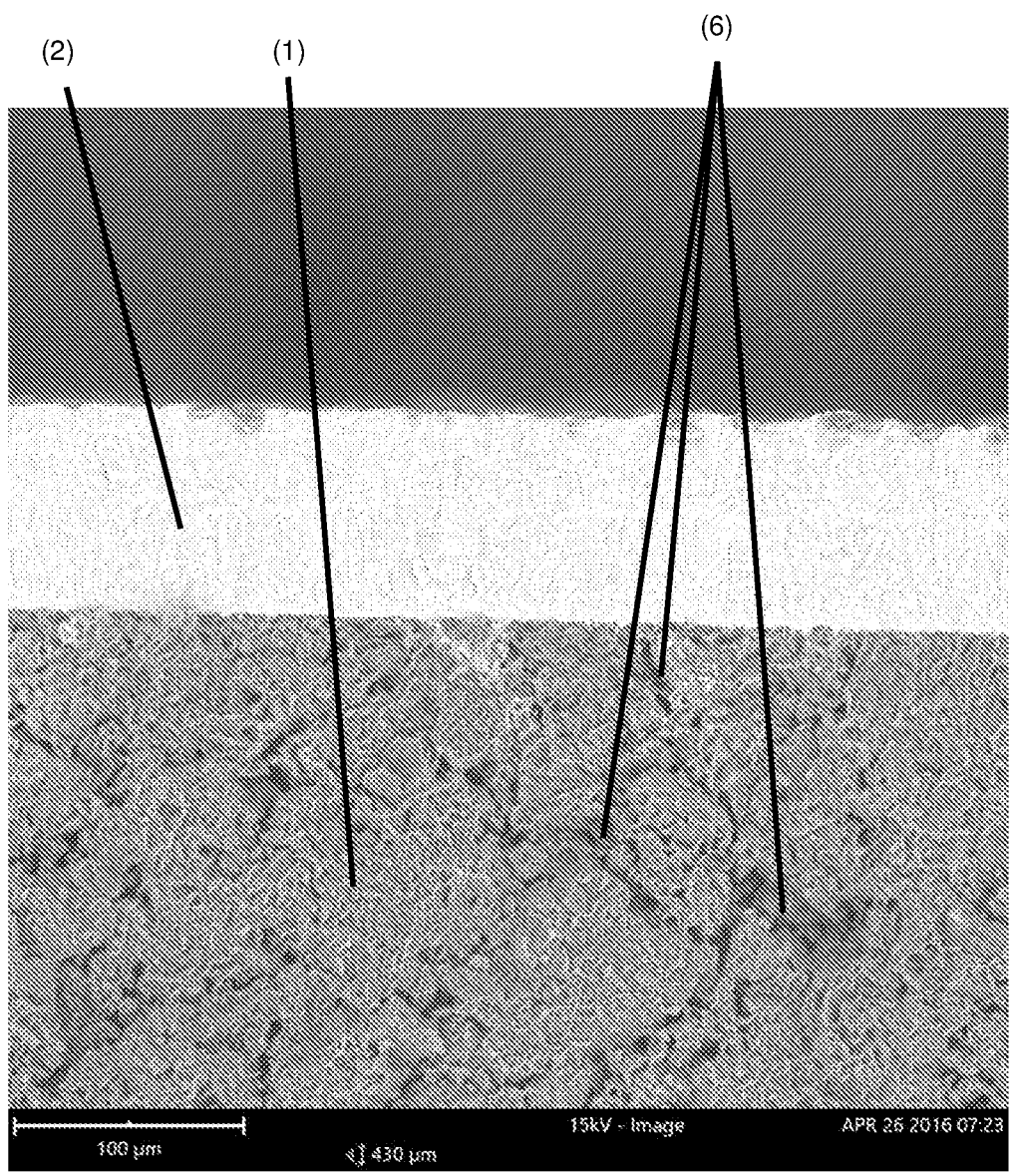
FIG. 3 shows a SEM image of a silicon carbide coated body with a SiC coating layer (2) of nearly 100 µm thickness on the porous graphite substrate (1) but without formation of tendrils and an interfacial layer. The open pores (6) of the graphite substrate (1) are well apparent.

A further example, illustrating the SiC multilayer structure due to varying DMS amounts is shown in FIG. 2.

Example 4—DMS Purity (Siloxanes)

A silicon carbide coated body was prepared with the process of the present invention with DMS of varying siloxane impurities.

DMS with the following amounts of siloxane impurities were used:

| Siloxane compound | DMS Sample A | DMS Sample B | DMS Sample C |
| --- | --- | --- | --- |
| 1,3-dichloro-1,1,3,3,-tetramethyldisiloxane | 0.193 wt. % | 0.103 wt. % | 0.710 wt. % |
| 1,3-dichloro-1,1,3,5,5,5,-hexamethyltrisiloxane | 0.042 wt. % | 0.072 wt. % | 0.110 wt. % |
| octamethylcyclotetrasiloxane | 0.112 wt. % | 0.157 wt. % | 0.156 wt. % |
| total amount of siloxane impurities | 0.389 wt. % | 0.375 wt. % | 1.04 wt. % |
| total amount of impurities | 0.119 wt. % | 0.580 wt. % | 1.239 wt. % |

With DMS according to sample A and B the formation of SiC tendrils occurred according to the present invention.

With DMS according to sample C no sufficient formation of SiC tendrils occurred.

Further, the following ranges were found as effective with respect to the desired tendril formation:

| Total Siloxane Content | Tendril formation |
|---|---|
| >2.00 wt. % | − |
| 0.50 to 2.00 wt. % | + |
| <0.50 wt. % | ++ |

"−" represents no or insufficient tendril formation in the open pores
"+" represents moderate to low tendril formation in the open pores
"++" represents adequate to optimum tendril formation in the open pores Example 5—DMS Purity (Mn)

A silicon carbide coated body was prepared with the process of the present invention with DMS of varying manganese impurities.

DMS with the following amounts of manganese impurities were used:

| metal element | DMS Sample A | DMS Sample B | DMS Sample C |
|---|---|---|---|
| manganese (Mn) | 2 ppb wt. | 11 ppb wt. | 150 ppb wt. |

With DMS according to sample A and B the formation of SiC tendrils occurred according to the present invention.

With DMS according to sample C no sufficient formation of SiC tendrils occurred.

Further, the following ranges were found as effective with respect to the desired tendril formation:

| Total Manganese Content | Tendril formation |
|---|---|
| ≥150 ppb wt. | − |
| 40 to 150 ppb wt. | + |
| <40 ppb wt. | ++ |

"−" represents no or insufficient tendril formation in the open pores
"+" represents moderate to low tendril formation in the open pores
"++" represents adequate to optimum tendril formation in the open pores Example 6—DMS Purity (Cu)

A silicon carbide coated body was prepared with the process of the present invention with DMS of varying copper impurities.

DMS with the following amounts of copper impurities were used:

| metal element | DMS Sample A | DMS Sample B | DMS Sample C |
|---|---|---|---|
| copper (Cu) | 1 ppb wt. | 18 ppb wt. | 41 ppb wt. |

With DMS according to sample A and B the formation of SiC tendrils occurred according to the present invention.

With DMS according to sample C no sufficient formation of SiC tendrils occurred.

Further, the following ranges were found as effective with respect to the desired tendril formation:

| Total Copper Content | Tendril formation |
|---|---|
| ≥50 ppb wt. | − |
| 30 to <50 ppb wt. | + |
| <30 ppb wt. | ++ |

"−" represents no or insufficient tendril formation in the open pores
"+" represents moderate to low tendril formation in the open pores
"++" represents adequate to optimum tendril formation in the open pores Example 7—DMS Purity (Zn)

A silicon carbide coated body was prepared with the process of the present invention with DMS of varying zinc impurities.

DMS with the following amounts of zinc impurities were used:

| metal element | DMS Sample A | DMS Sample B | DMS Sample C |
|---|---|---|---|
| zinc (Zn) | 1 ppb wt. | 19 ppb wt. | 42 ppb wt. |

With DMS according to sample A and B the formation of SiC tendrils occurred according to the present invention.

With DMS according to sample C no sufficient formation of SiC tendrils occurred.

Further, the following ranges were found as effective with respect to the desired tendril formation:

| Total Zinc Content | Tendril formation |
|---|---|
| ≥50 ppb wt. | − |
| 30 to <50 ppb wt. | + |
| <30 ppb wt. | ++ |

"−" represents no or insufficient tendril formation in the open pores
"+" represents moderate to low tendril formation in the open pores
"++" represents adequate to optimum tendril formation in the open pores Example 8—DMS Purity (Siloxane Plus Mn Plus Cu Plus Zn)

The following ranges of total siloxane content in the presence of Mn, Cu and Zn metal impurities were found as effective with respect to the desired tendril formation:

| Total Siloxane Content | Total Manganese Content | Total Copper Content | Total Zinc Content | Tendril formation |
|---|---|---|---|---|
| >2.00 wt. % | ≥150 ppb wt. | ≥50 ppb wt. | ≥50 ppb wt. | − |
| 0.50 to 2.00 wt. % | 40 to 150 ppb wt. | 30 to <50 ppb wt. | 30 to <50 ppb wt. | + |
| <0.50 wt. % | <40 ppb wt. | <30 ppb wt. | <30 ppb wt. | ++ |

"−" represents no or insufficient tendril formation in the open pores
"+" represents moderate to low tendril formation in the open pores
"++" represents adequate to optimum tendril formation in the open pores

The invention claimed is:

1. A method of depositing a silicon carbide coating on a substrate by chemical vapor deposition (CVD) using a dimethyldichlorosilane precursor material, wherein the dimethyldichlorosilane precursor material comprises:
    (A) dimethyldichlorosilane as a main component and
    (B) at least one further component being a siloxane compound or a mixture of siloxane compounds, wherein a content of the at least one further component (B) is >0 to 2.00 wt. % relative to the dimethyldichlorosilane precursor material.

2. The method of claim 1, wherein the dimethyldichlorosilane precursor material comprises a content of siloxane compounds (B) of >0 to 1.500 wt. %.

3. The method of claim 1, wherein the dimethyldichlorosilane precursor material comprises a content of siloxane compounds (B) of not more than 0.500 wt. %.

4. The method of claim 1, wherein the dimethyldichlorosilane precursor material comprises:
    >0 to 1.000 wt. % 1,3-dichloro-1,1,3,3,-tetramethyldisiloxane;
    >0 to 0.200 wt. % 1,3-dichloro-1,1,3,5,5,5,-hexamethyltrisiloxane;
    >0 to 0.200 wt. % octamethylcyclotetrasiloxane;
    or a combination thereof.

5. The method of claim 1, wherein the dimethyldichlorosilane precursor material further comprises:
    (C) one or more metal elements selected from the group consisting of Na, Mg, Al, Ca, Ti, Cr, Mn, Fe, Co, Ni, Cu, Zn, Mo, and W, wherein a content of the one or more metal elements (C) is less than or equal to 30.00 ppm wt.

6. The method of claim 5, wherein the one or more metal elements is Mn, and a content of the Mn metal element (C) is <150 ppb wt., relating to the dimethyldichlorosilane precursor material.

7. The method of claim 5, wherein the one or more metal elements is Cu, and a content of the Cu metal element (C) is <50 ppb wt., relating to the dimethyldichlorosilane precursor material.

8. The method of claim 5, wherein the one or more metal elements is Zn, and a content of the Zn metal element (C) is <50 ppb wt., relating to the dimethyldichlorosilane precursor material.

9. The method of claim 5, wherein:
    the one or more metal elements are Mn, Cu and Zn;
    a content of Mn (C) is <150 ppb wt., relating to the dimethyldichlorosilane precursor material;
    a content of Cu (C) is <50 ppb wt., relating to the dimethyldichlorosilane precursor material; and
    a content of Zn (C) is <50 ppb wt., relating to the dimethyldichlorosilane precursor material.

10. The method of claim 1, wherein the chemical vapor deposition is carried out using $H_2$ as purge gas.

11. The method of claim 1, wherein the dimethyldichlorosilane precursor material is further comprises one or more of the following elements in an amount of:
    calcium<60.00 ppb by weight,
    magnesium<10.00 ppb by weight,
    aluminium<12.00 ppb by weight,
    titanium<1.00 ppb by weight,
    chromium<60.00 ppb by weight,
    iron<25000 ppb by weight,
    cobalt<1.00 ppb by weight,
    nickel<30.00 ppb by weight,
    zinc<40.00 ppb by weight, or
    molybdenum<10.00 ppb by weight.

* * * * *